(12) United States Patent
Furuya et al.

(10) Patent No.: US 9,283,757 B2
(45) Date of Patent: Mar. 15, 2016

(54) LIQUID EJECTING HEAD, LIQUID EJECTING APPARATUS, PIEZOELECTRIC ELEMENT, AND ULTRASONIC SENSOR

(71) Applicant: SEIKO EPSON CORPORATION, Tokyo (JP)

(72) Inventors: Noboru Furuya, Chino (JP); Masao Nakayama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/179,187

(22) Filed: Feb. 12, 2014

(65) Prior Publication Data

US 2014/0240405 A1    Aug. 28, 2014

(51) Int. Cl.
*B41J 2/045* (2006.01)
*B41J 2/14* (2006.01)
*H01L 41/09* (2006.01)
*B41J 2/055* (2006.01)
*B41J 2/16* (2006.01)
*H01L 41/04* (2006.01)
*H01L 41/08* (2006.01)
*H01L 41/332* (2013.01)

(52) U.S. Cl.
CPC ............ *B41J 2/14201* (2013.01); *B41J 2/055* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1645* (2013.01); *B41J 2/1646* (2013.01); *H01L 41/04* (2013.01); *H01L 41/0805* (2013.01); *H01L 41/0973* (2013.01); *H01L 41/332* (2013.01); *B41J 2002/14241* (2013.01)

(58) Field of Classification Search
None
See application file for complete search history.

(56) References Cited

U.S. PATENT DOCUMENTS

| 8,029,109 B2 | 10/2011 | Yazaki | |
| 2011/0074890 A1* | 3/2011 | Miyazawa et al. | 347/71 |
| 2012/0236081 A1* | 9/2012 | Nakayama et al. | 347/68 |

FOREIGN PATENT DOCUMENTS

JP    2009-172878    8/2009

* cited by examiner

*Primary Examiner* — Erica Lin
(74) *Attorney, Agent, or Firm* — Workman Nydegger

(57) ABSTRACT

A liquid ejecting head which includes a piezoelectric element which includes a first electrode, a piezoelectric layer which is provided on the first electrode, and on which a plurality of piezoelectric films are laminated, a second electrode which is provided on the piezoelectric layer, and a plurality of active units which are interposed between the first electrode and the second electrode, and a pressure generating chamber which communicates with nozzle openings which eject liquid, and in which a pressure fluctuation is generated by the piezoelectric element, in which a plurality of grooves with inner faces facing the first electrode side are formed on a side surface of the piezoelectric layer on each interface of each of the piezoelectric films along a first direction and a second direction which cross a third direction which goes from the first electrode to the second electrode.

12 Claims, 19 Drawing Sheets

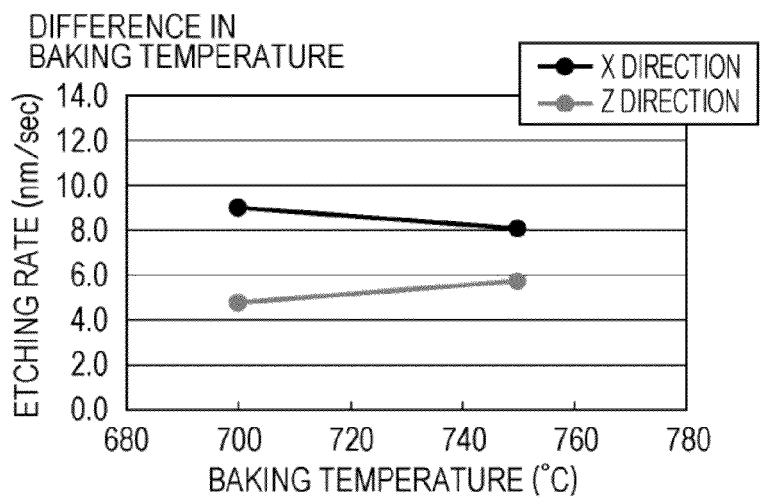
FIG. 19A DIFFERENCE IN BAKING TEMPERATURE
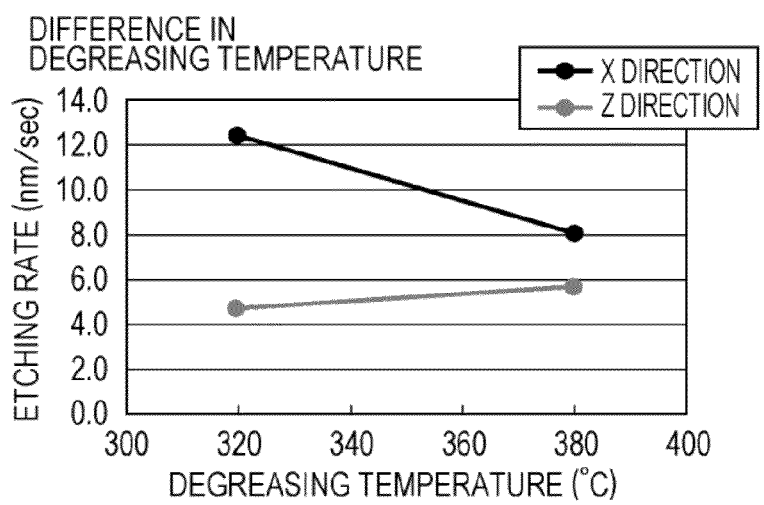
FIG. 19B DIFFERENCE IN DEGREASING TEMPERATURE
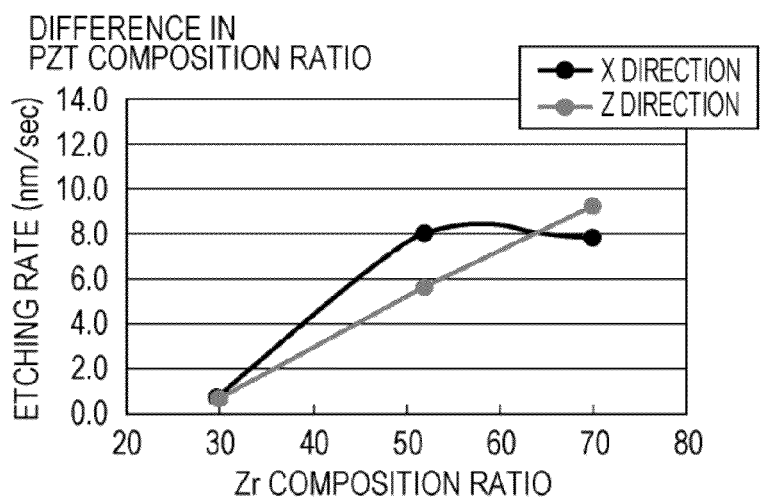
FIG. 19C DIFFERENCE IN PZT COMPOSITION RATIO

LIQUID EJECTING HEAD, LIQUID EJECTING APPARATUS, PIEZOELECTRIC ELEMENT, AND ULTRASONIC SENSOR

BACKGROUND

1. Technical Field

The present invention relates to a liquid ejecting head, a liquid ejecting apparatus, a piezoelectric element, and an ultrasonic sensor.

2. Related Art

In the related art, a liquid ejecting head which ejects droplets from a nozzle which communicates with a pressure generating chamber by generating a pressure fluctuation in liquid in the pressure generating chamber by transforming a piezoelectric element has been known. As a representative example thereof, there is an ink jet recording head which ejects ink droplets as droplets.

The ink jet recording head includes, for example, a piezoelectric element on one surface side of a flow path forming substrate on which the pressure generating chamber which communicates with nozzle openings is provided, and ejects ink droplets from nozzles by generating a pressure fluctuation in the pressure generating chamber by transforming a vibrating plate using a drive of the piezoelectric element.

Such a piezoelectric element is configured of a first electrode which is provided on the vibrating plate, a piezoelectric layer, and a second electrode (for example, refer to JP-A-2009-172878).

When making density of a piezoelectric element high according to high density of nozzle openings, the thickness or an area of the piezoelectric element becomes small, and an electric capacitance increases. The increase in the electric capacitance leads to an increase in a calorific value of the piezoelectric element, and accordingly, there is a problem in that a performance of the piezoelectric element deteriorates due to the heat generation.

In addition, there are problems in that a performance of an ultrasonic sensor using the piezoelectric element also deteriorates due to the heat generation, and an ink ejecting performance in an ink jet recording head using the piezoelectric element also deteriorates due to the heat generation. In addition, such a problem exists not only in the ink jet recording head, also in a liquid ejecting head which ejects liquid other than ink.

SUMMARY

An advantage of some aspects of the invention is to provide a liquid ejecting head, a liquid ejecting apparatus, a piezoelectric element, and an ultrasonic sensor in which a performance deterioration due to a heat generation is prevented.

According to an aspect of the present invention, there is provided a liquid ejecting head which includes a piezoelectric element including a first electrode, a piezoelectric layer which is provided on the first electrode, and on which a plurality of piezoelectric films are laminated, a second electrode which is provided on the piezoelectric layer, and a plurality of active units which are interposed between the first electrode and the second electrode, and a pressure generating chamber which communicates with nozzle openings which eject liquid, and in which a pressure fluctuation is generated by the piezoelectric element, in which a plurality of grooves with inner faces facing the first electrode side are formed on a side surface of the piezoelectric layer on each interface of each of the piezoelectric films along a direction which crosses a direction which goes from the first electrode to the second electrode.

According to the aspect, since it is possible to prevent a performance deterioration due to a heat generation of the piezoelectric element even when the piezoelectric element is made to be high density in responding to high density of nozzle openings, it is possible for the liquid ejecting head to eject liquid from the nozzle openings of high density in a stable manner and with high precision.

The piezoelectric layer may be formed so that the piezoelectric film on the first electrode side protrudes to an outside of the piezoelectric film on the second electrode side. In this manner, it is possible to make heat radiation easier.

The second electrode may be formed using an electroless plating method. In this manner, it is possible to form the second electrode with a uniform thickness which is continuous to the entire surface of the piezoelectric layer including the inside of grooves. Accordingly, heat of the piezoelectric layer is radiated outside through the second electrode. In addition, since the second electrode continuously covers the entire surface of the piezoelectric layer including the inside of the grooves, the second electrode functions as a protective film which protects the piezoelectric layer, and can protect the piezoelectric layer from foreign substances, or the like.

The second electrode may include a first layer formed of conductive metal oxide which is formed on the piezoelectric layer, and a conductive second layer which is formed on the first layer. Due to this, it is possible to prevent a defect, or the like, from occurring on an interface between the piezoelectric layer and the first layer. Due to this, it is possible to obtain a liquid ejecting head including a piezoelectric element with an excellent piezoelectric property.

The second layer of the second electrode may be formed using the electroless plating method. Due to this, it is possible to form the second electrode with the uniform thickness which is continuous in the entire surface of the piezoelectric layer including the first layer which is formed of the conductive metal oxide, and the inside of the grooves. Accordingly, it is possible to radiate the heat of the piezoelectric layer to the outside through the second electrode, to cause the second electrode to function as the protective film which protects the piezoelectric layer, and to protect the piezoelectric layer from foreign substances, or the like.

According to another aspect of the invention, there is provided a liquid ejecting apparatus including the liquid ejecting head according to the aspect.

According to the aspect, it is possible to realize a liquid ejecting apparatus in which a performance deterioration due to heat radiation of a piezoelectric element is prevented.

According to a further another aspect of the invention, there is provided a piezoelectric element which includes a first electrode, a piezoelectric layer which is provided on the first electrode, and on which a plurality of piezoelectric films are laminated, a second electrode which is provided on the piezoelectric layer, and a plurality of active units which are interposed between the first electrode and the second electrode, in which a plurality of grooves with inner faces facing the first electrode side are formed on a side surface of the piezoelectric layer on each interface of each of the piezoelectric layers along a direction which crosses a direction which goes from the first electrode to the second electrode.

According to the aspect, a side surface of the piezoelectric layer on which the grooves are provided functions as a heat radiating plate, the generated heat is radiated to the outside, and a temperature rise in the piezoelectric element is suppressed. Due to this, it is possible to obtain a piezoelectric element with a good piezoelectric property by preventing a performance deterioration in the piezoelectric element due to an increase in a calorific value.

According to a still further another aspect of the invention, there is provided an ultrasonic sensor which includes the piezoelectric element according to the aspect.

According to the aspect, it is possible to realize an ultrasonic sensor in which a performance deterioration due to a heat generation of the piezoelectric element is prevented.

BRIEF DESCRIPTION OF THE DRAWINGS

The invention will be described with reference to the accompanying drawings, wherein like numbers reference like elements.

FIGS. 19A to 19C are graphs which illustrate a rate difference due to a degreasing temperature, a baking temperature, and a Zr composition ratio.

DESCRIPTION OF EXEMPLARY EMBODIMENTS

Hereinafter, embodiments of the present invention will be described with reference to drawings.

First Embodiment

Figure 1:
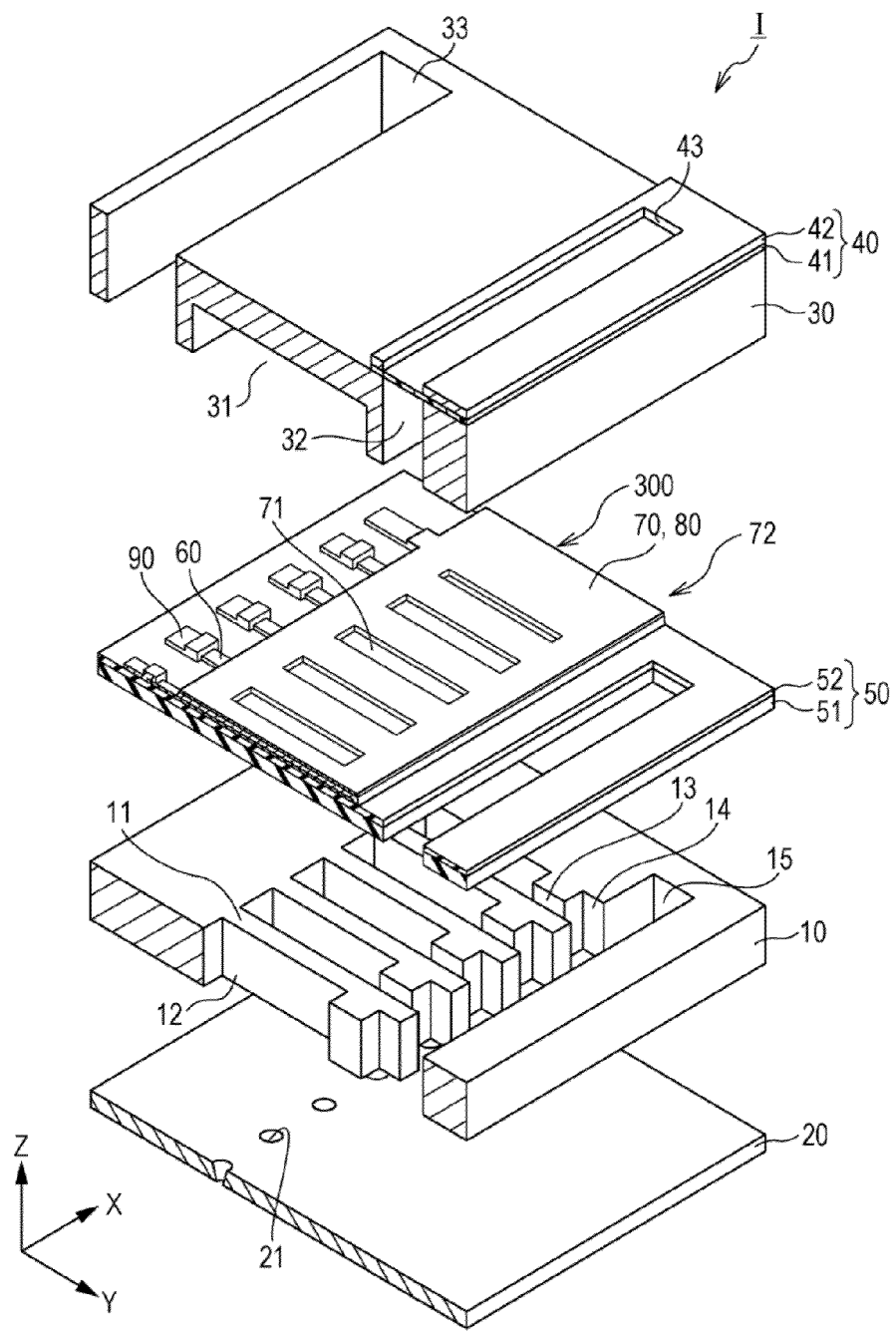
FIG. 1 is an exploded perspective view of an ink jet recording head according to a first embodiment.
Figure 2A:
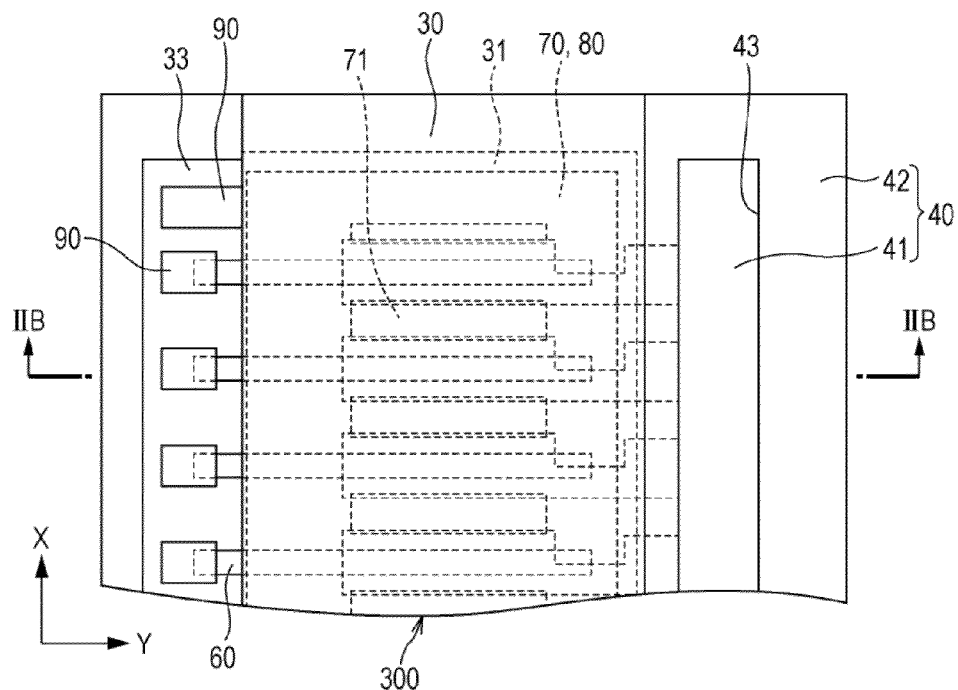
FIGS. 2A and 2B are a plan view and a cross-sectional view of the ink jet recording head according to the first embodiment.
Figure 2B:
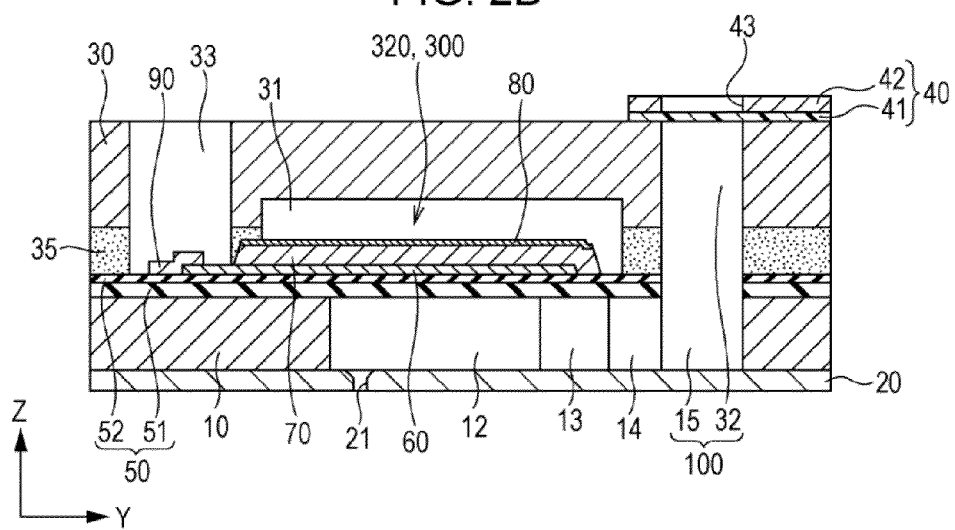

FIG. 1 is a perspective view of an ink jet recording head as an example of a liquid ejecting head according to a first embodiment of the invention, and FIGS. 2A and 2B are a plan view and a cross-sectional view of the ink jet recording head.

As illustrated, a pressure generating chamber 12 is formed on a flow path forming substrate 10 which is included in an ink jet recording head I as an example of a liquid ejecting head according to the embodiment. In addition, the pressure generating chamber 12 which is partitioned by a plurality of partitioning walls 11 is aligned along a direction in which a plurality of nozzle openings 21 which eject ink of the same color are aligned. Hereinafter, the direction is referred to as an aligning direction of the pressure generating chamber 12, or a first direction X. In addition, a direction which is orthogonal to the first direction X in a plane of the flow path forming substrate 10 is set to a second direction Y. In addition, a direction which is orthogonal to the first and second directions X and Y is set to a third direction Z. In the figure, one column of the pressure generating chamber 12 which is aligned in the first direction X is illustrated, however, a plurality of columns of the pressure generating chamber 12 may be aligned in the second direction Y.

An ink supply path 13 and a communicating path 14 are partitioned by a plurality of partitioning walls 11 on one end side of the pressure generating chamber 12 of the flow path forming substrate 10 in a longitudinal direction, that is, on one end side in the second direction Y. A communication unit 15 which configures a part of a manifold 100 as a common ink chamber (liquid chamber) of each of the pressure generating chambers 12 is formed on the outside of the communicating path 14 (side opposite to pressure generating chamber 12 in second direction Y). That is, a liquid flow path which is formed by the pressure generating chamber 12, the ink supply path 13, the communicating path 14, and the communication unit 15 is provided on the flow path forming substrate 10.

A nozzle plate 20 on which nozzle openings 21 which communicate with each of the pressure generating chambers 12 are punched is bonded to on one surface side of the flow path forming substrate 10, that is, a surface on which the liquid flow path such as the pressure generating chamber 12 is open using an adhesive, a heat welding film, or the like. That is, the nozzle openings 21 are aligned on the nozzle plate 20 in the first direction X.

A vibrating plate 50 is formed on the other surface side of the flow path forming substrate 10. The vibrating plate 50 according to the embodiment includes an elastic film 51 which is formed on the flow path forming substrate 10, and an insulating film 52 which is formed on the elastic film 51. In addition, the liquid flow path such as the pressure generating chamber 12 is formed by performing anisotropic etching with respect to the flow path forming substrate 10 from one surface side thereof, and the other surface of the liquid flow path such as the pressure generating chamber 12 is formed by the vibrating plate 50 (elastic film 51).

A piezoelectric element 300 which is configured of a first electrode 60 of which the thickness is approximately 0.2 µm, for example, a piezoelectric layer 70 of which the thickness is approximately 1.0 µm, for example, and a second electrode 80 of which the thickness is approximately 0.05 µm, for example, is formed on the insulating film 52. The piezoelectric element 300 which is provided on the substrate (flow path forming substrate 10) functions as an actuator unit in the embodiment.

Figure 3A:
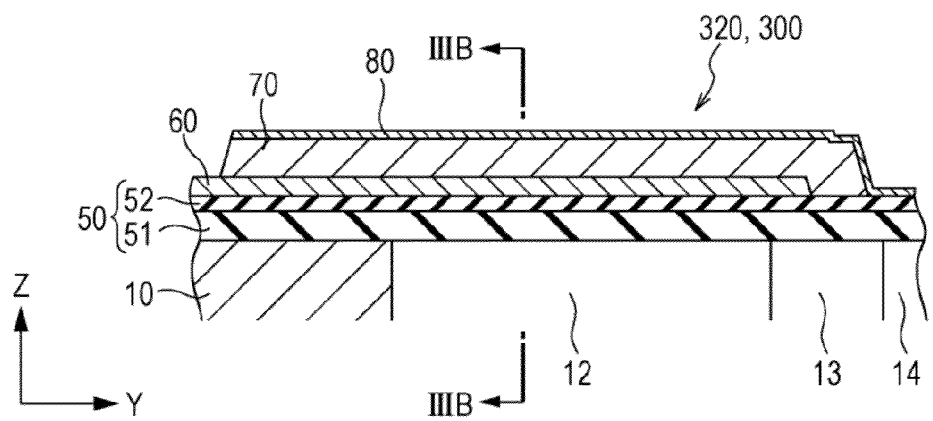
FIGS. 3A and 3B are cross-sectional views in which main portions of a piezoelectric element according to the first embodiment are enlarged.

Hereinafter, the piezoelectric element 300 which configures the actuator unit will be described in detail. FIG. 3A is a cross-sectional view in which main portions of the piezoelectric element according to the first embodiment of the invention are enlarged, and FIG. 3B is a cross-sectional view which is taken along line IIIB-IIIB of FIG. 3A.

Figure 3B:
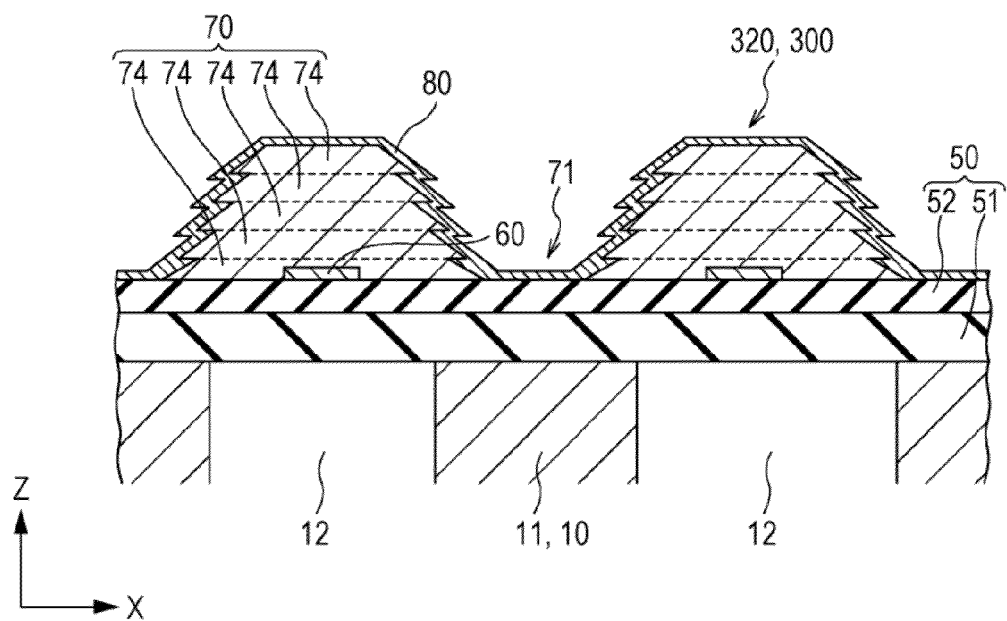

As illustrated in FIGS. 3A and 3B, the first electrode 60 which configures the piezoelectric element 300 is cut into pieces in each of the pressure generating chambers 12, and configures an individual electrode which is independent in each of the piezoelectric elements 300. In addition, the first electrode 60 is formed with the width which is smaller than the width of the pressure generating chamber 12 in the first direction X of the pressure generating chamber 12. That is, in the first direction X of the pressure generating chamber 12, an end portion of the first electrode 60 is located on the inside of a region facing the pressure generating chamber 12. In the second direction Y of the pressure generating chamber 12, both end portions of the first electrode 60 are extended to the outside of the pressure generating chamber 12, respectively. In addition, a material of the first electrode 60 is not particularly limited when it is a metal material, and, for example, metal such as Ti, Pt, Ta, Ir, Sr, In, Sn, Au, Al, Fe, Cr, Ni, Cu, or only one of these materials, a combination of two or more of these materials, or lamination thereof may be used in the first electrode 60.

The piezoelectric layer 70 is continuously provided over the first direction X so that the second direction Y has a predetermined width. The width of the piezoelectric layer 70 in the second direction Y is larger than the length of the pressure generating chamber 12 in the second direction Y. For this reason, the piezoelectric layer 70 is provided up to the outside of the pressure generating chamber 12 in the second direction Y of the pressure generating chamber 12.

An end portion of the piezoelectric layer 70 on one end side (according to the embodiment, ink supply path side) of the pressure generating chamber 12 in the second direction Y is located at the outside of the end portion of the first electrode 60. That is, the end portion of the first electrode 60 is covered by the piezoelectric layer 70. The end portion of the piezoelectric layer 70 on the other end side of the pressure generating chamber 12 in the second direction Y is located at the inside (pressure generating chamber 12 side) of the end portion of the first electrode 60.

In addition, a lead electrode 90 which is formed of, for example, gold (Au), or the like, is connected to the first electrode 60 which is extended to the outside of the piezoelectric layer 70. Though it is not illustrated, the lead electrode 90 configures a terminal unit to which connection wiring which is connected to a driving circuit, or the like, is connected.

In addition, concave portions 71 which face each of the partitioning walls 11 are formed on the piezoelectric layer 70. The width of the concave portion 71 in the first direction X is approximately the same as that of each of the partitioning walls 11 in the first direction X, or is larger than that. That is, the piezoelectric layer 70 is continuously formed over each of the pressure generating chambers 12 along the first direction X, and the concave portion 71 is formed by eliminating a part thereof which faces each of the partitioning walls 11. Since rigidity of a portion facing the end portion of the pressure generating chamber 12 of the vibrating plate 50 in the width direction (so-called arm portion of vibrating plate 50) is suppressed due to the concave portion 71, it is possible to preferably displace the piezoelectric element 300.

As the piezoelectric layer 70, there is a crystalline film with a perovskite structure (perovskite type crystal) which is formed of a ferroelectric ceramic material showing an electromechanical conversion operation, and is formed on the first electrode 60. As a material of the piezoelectric layer 70, for example, it is possible to use a ferroelectric piezoelectric material such as lead zirconate titanate (PZT), a material in which metal oxide such as niobium oxide, nickel oxide, or magnesium oxide is added to the lead zirconate titanate, or the like. Specifically, it is possible to use lead titanate ($PbTiO_3$), lead zirconate titanate (Pb (Zr, Ti)$O_3$), lead zirconate ($PbZrO_3$), lead titanate lanthanum ((Pb, La), $TiO_3$), lead lanthanum zirconate titanate ((Pb, La)(Zr, Ti)$O_3$), magnesium niobium acid zirconium lead titanate (Pb (Zr, Ti)(Mg, Nb)$O_3$), or the like. According to the embodiment, as the material of the piezoelectric layer 70, lead zirconate titanate (PZT) is used.

In addition, the material of the piezoelectric layer 70 is not limited to a lead-based piezoelectric material including lead, and it is also possible to use a non-lead-based piezoelectric material not including lead. As the non-lead-based piezoelectric material, for example, there are bismuth ferrate (($BiFeO_3$), abbreviated to "BFO"), barium titanate ((($BaTiO_3$), abbreviated to "BT"), potassium sodium niobate ((K, Na) ($NbO_3$), abbreviated to "KNN"), potassium sodium lithium niobate ((K, Na, Li)($NbO_3$)), potassium sodium lithium niobate tantalate ((K, Na, Li)(Nb, Ta)$O_3$), bismuth potassium titanate (($Bi_{1/2}K_{1/2}$)$TiO_3$, abbreviated to "BKT"), bismuth sodium titanate (($Bi_{1/2}Na_{1/2}$)$TiO_3$, abbreviated to "BNT"), bismuth manganate ($BiMnO_3$, abbreviated to "BM"), complex oxide with a perovskite structure including bismuth, potassium, titanium, and iron ($x[(Bi_xK_{1-x})TiO_3]$-(1-x) ([$BiFeO_3$], abbreviated to "BKT-BF"), complex oxide with a perovskite structure including bismuth, iron, barium, and titanium ((1-x)[$BiFeO_3$]-x[$BaTiO_3$], abbreviated to "BFO-BT"), a material in which metal such as manganese, cobalt, or chromium is added thereto ((1-x)[Bi($Fe_{1-y}M_y$)$O_3$]-x[$BaTiO_3$](M is Mn, Co, or Cr)), or the like.

The second electrode 80 is continuously provided on the piezoelectric layer 70 in the first direction X of the pressure generating chamber 12, and configures a common electrode which is common to the plurality of piezoelectric elements 300. An end portion of the second electrode 80 in one end side of the pressure generating chamber 12 in the second direction Y is located at the outside of the end portion of the piezoelectric layer 70. That is, the end portion of the piezoelectric layer 70 is covered by the second electrode 80. In addition, an end portion of the second electrode 80 in the other end side of the pressure generating chamber 12 in the second direction Y is located at the inside (pressure generating chamber 12 side) of the end portion of the piezoelectric layer 70.

Such a material of the second electrode 80 is not particularly limited when it is a metal material, and for example, it is possible to use the same material as that of the first electrode 60. According to the embodiment, the second electrode 80 is formed of nickel (Ni, Ni—P, or Ni—B), and is formed using electroless plating method, though it will be described later in detail.

In the piezoelectric element 300 with such a configuration, displacement occurs when a voltage is applied between the first electrode 60 and the second electrode 80. That is, piezoelectric distortion occurs in the piezoelectric layer 70 which is interposed between the first electrode 60 and the second electrode 80 when a voltage is applied between both the electrodes. In addition, a portion at which the piezoelectric distortion occurs in the piezoelectric layer 70 when the voltage is applied between both the electrodes is referred to as an active unit 320. In contrast to this, a portion at which the piezoelectric distortion does not occur in the piezoelectric layer 70 is referred to as a non-active unit. In addition, in the active unit 320 at which the piezoelectric distortion occurs in the piezoelectric layer 70, a portion facing the pressure generating chamber 12 is referred to as a flexible portion, and a portion on the outside of the pressure generating chamber 12 is referred to as a non-flexible portion.

According to the embodiment, all of the first electrode 60, the piezoelectric layer 70, and the second electrode 80 are continuously provided up to the outside of the pressure generating chamber 12 in the second direction Y of the pressure generating chamber 12. That is, the active unit 320 is continuously provided up to the outside of the pressure generating chamber 12. For this reason, a portion facing the pressure generating chamber 12 of the piezoelectric element 300 in the active unit 320 becomes the flexible portion, and a portion on the outside of the pressure generating chamber 12 becomes the non-flexible portion.

In addition, since the first electrode 60 is cut into pieces in each of the pressure generating chambers 12 as described above, a step difference in the first electrode 60 is formed in the piezoelectric element 300 along the second direction Y, that is, along the longitudinal direction (second direction Y) of the active unit 320.

The piezoelectric layer 70 which configures such a piezoelectric element 300 is configured by a plurality of piezoelectric films 74 which are laminated. In addition, a laminating direction in the embodiment is a direction which goes from the first electrode 60 to the second electrode 80. The piezoelectric film 74 of the first layer as a bottom layer on the flow path forming substrate 10 side is provided on the insulating film 52 and the first electrode 60 excluding a region which is the concave portion 71. In addition, piezoelectric films 74 after the second layer are provided on the piezoelectric film 74 on the lower layer side.

Figure 4:
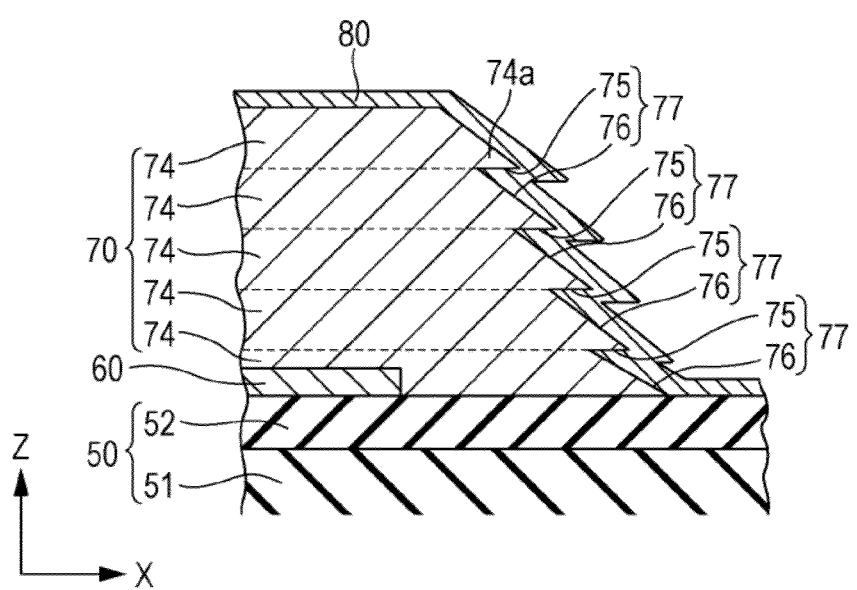
FIG. 4 is a cross-sectional view in which the main portions of the piezoelectric element according to the first embodiment are enlarged.

A plurality of grooves are formed on a side surface of the piezoelectric layer 70 of the piezoelectric element 300. FIG. 4 is a cross-sectional view in which main portions of the piezoelectric element are enlarged. The grooves which are formed on the side surface of the piezoelectric layer 70 will be described in detail using the same figure.

A plurality (according to the embodiment, four) of grooves 77 having inner faces 75 facing the first electrode 60 side are formed on the side surface of the piezoelectric layer 70 on an interface of each of the piezoelectric films 74 along a direction (first direction X and second direction Y) which crosses a laminating direction (third direction Z) which goes from the first electrode 60 to the second electrode 80.

The groove 77 which is formed on each interface of the piezoelectric film 74 is a groove which is formed when two end portions 74a which are protruded to the outside of the neighboring two layers of piezoelectric films 74 face each other.

In the neighboring two layers of piezoelectric films 74, a film on the second electrode 80 side is also referred to as an upper layer side piezoelectric film 74, and a film on the first electrode 60 side is also referred to as a lower layer side piezoelectric film 74. The front surface of the end portion 74a of the upper layer side piezoelectric film 74 on the lower layer side piezoelectric film 74 is set to an inner face 75, and the front surface of the end portion 74a of the lower layer side piezoelectric film 74 on the upper layer side piezoelectric film 74 is set to an inner face 76.

The inner face 75 faces the first electrode 60 side. When the inner face 75 faces the first electrode 60 side, it means that the inner face 75 is parallel to the first electrode 60 (plane which is formed by first direction X and second direction Y), or an angle which is formed by the inner face 75 and the first electrode 60 is an acute angle. When the groove 77 is formed so that the inner face 75 faces the first electrode 60 in this manner, the side surface of the piezoelectric layer 70 is formed in a wave surface shape which is formed by the plurality of grooves 77.

By providing the groove 77 on the side surface of the piezoelectric layer 70, radiation of heat of the piezoelectric layer 70 to the outside is promoted. That is, the side surface of the piezoelectric layer 70 on which the groove 77 is provided functions as a heat radiating plate, and it is possible to suppress a temperature rise in the piezoelectric element 300, since generated heat is radiated to the outside.

When describing in detail, in such a piezoelectric layer 70 of which the side surface is formed with the groove 77, the second electrode 80 is formed over the entire surface of the piezoelectric layer 70 including the inside of the groove 77. As described above, according to the embodiment, since the second electrode 80 is formed using the electroless plating method, the second electrode 80 is also formed in such a groove 77, and is formed with the uniform thickness which is continuous on the entire surface of the piezoelectric layer 70. Accordingly, the heat of the piezoelectric layer 70 is radiated to the outside through the second electrode 80.

Since heat radiation is promoted due to the groove 77 in this manner, in the piezoelectric element 300 according to the embodiment, it is possible to prevent a performance deterioration by suppressing an increase in the calorific value, and to obtain an effect of a good piezoelectric performance.

In addition, the lower layer side piezoelectric film 74 protrudes to the outside of the upper layer side piezoelectric film 74. When forming each of the piezoelectric films 74 in this manner, the entire piezoelectric layer 70 has a tapered shape which becomes wide toward the first electrode 60 side from the second electrode 80. By forming each of the grooves 77 so as to have the tapered shape, the piezoelectric element 300 has a structure in which heat radiation becomes easier. In addition, a level of widening of the tapered shape on the side surface of the piezoelectric layer 70 is not particularly limited, it may not be the tapered shape, and the groove 77 may be formed so that the width of each of the piezoelectric films 74 is uniform.

In addition, the second electrode 80 which is formed using the electroless plating method continuously covers the entire surface of the piezoelectric layer 70 including the inside of the groove 77. In this manner, the second electrode 80 functions as a protective film which protects the piezoelectric layer 70, and can protect the piezoelectric layer 70 from foreign substances, or the like.

In addition, since it is possible to prevent a performance deterioration due to a heat generation of the piezoelectric element 300, even when the piezoelectric element 300 is made to be high density in responding to high density of the nozzle openings 21, it is possible for the ink jet recording head I to eject ink from the nozzle openings 21 of high density in a stable manner, and with high precision.

In addition, since the groove 77 of the piezoelectric layer 70 is provided at the non-active unit on the outside of the active unit 320 of the piezoelectric layer 70, the displacement of the piezoelectric element 300 is not influenced by the groove.

Figure 5A:
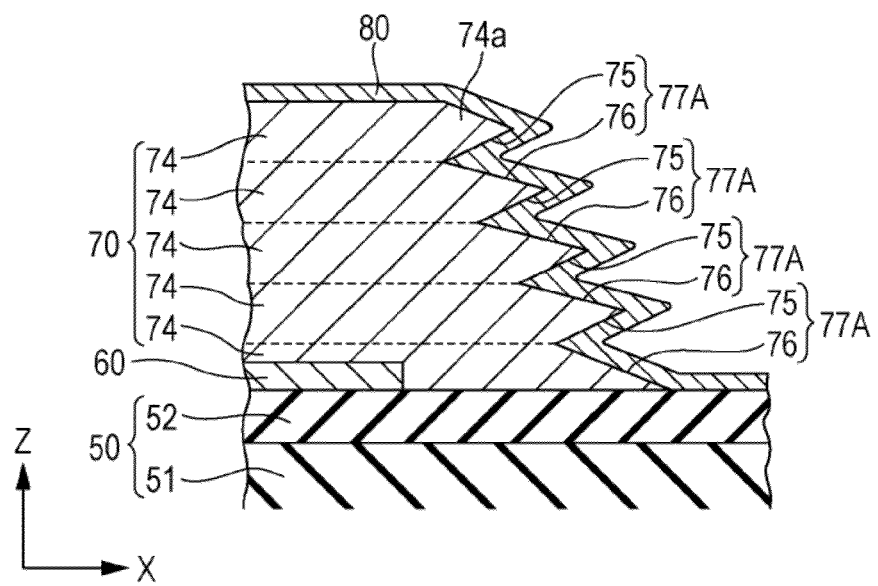
FIGS. 5A and 5B are cross-sectional views in which the main portions of the piezoelectric element according to the first embodiment are enlarged.
Figure 5B:
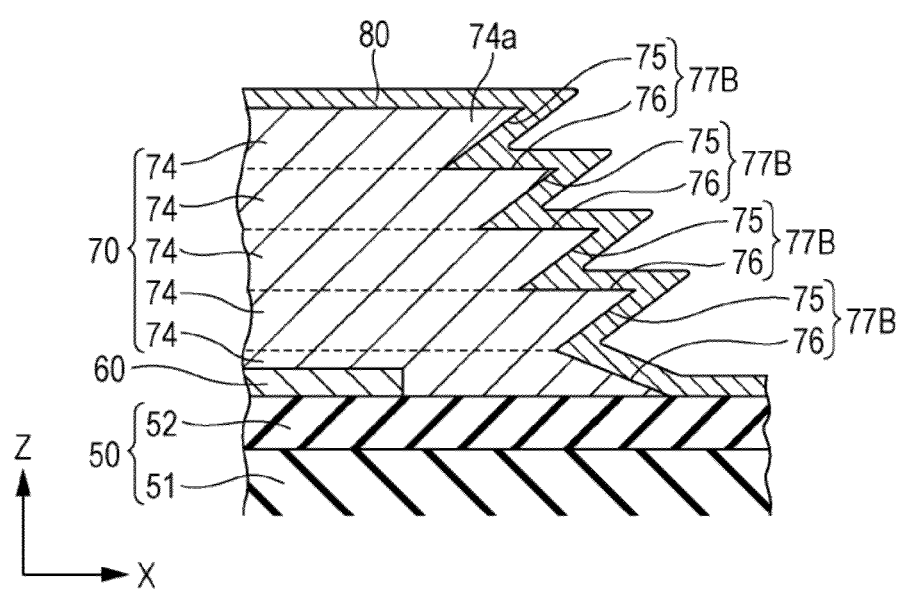

Here, another type of the groove 77 on the side surface of the piezoelectric layer 70 is illustrated. FIGS. 5A and 5B are cross-sectional views in which the main portions of the piezoelectric element are enlarged. The inner face 75 of the groove 77 which is illustrated in FIG. 4 is approximately parallel to the first electrode 60, however, an angle of a groove 77A which is illustrated in FIG. 5A which is formed by the inner face 75 and the first electrode 60 (plane which is formed by first direction X and second direction Y) is an acute angle. An inner face 76 of a groove 77B (excluding bottom layer) which is illustrated in FIG. 5B is approximately parallel to the first electrode 60. In addition, a lower layer side piezoelectric film 74 in any one of the grooves 77A and 77B protrudes to the outside of an upper layer side piezoelectric film 74, however, it is not necessarily limited to such a type. That is, the width in each of the lower layer side piezoelectric films 74 may be approximately the same as that of each of the upper layer side piezoelectric films 74 in the first direction X and the second direction Y, or may be smaller than that. In any of the grooves 77A and 77B, it is also possible to obtain the same operational effect as that of the piezoelectric element 300 including the groove 77 which is illustrated in FIG. 4.

As will be described later, such grooves 77, 77A, and 77B are formed by performing wet etching with respect to the piezoelectric layer 70. At this time, it is possible to form the above described grooves having various shapes by appropriately adjusting a difference in an etching rate between the third direction Z and the first direction X and second direction Y which are directions orthogonal thereto.

Figure 6:
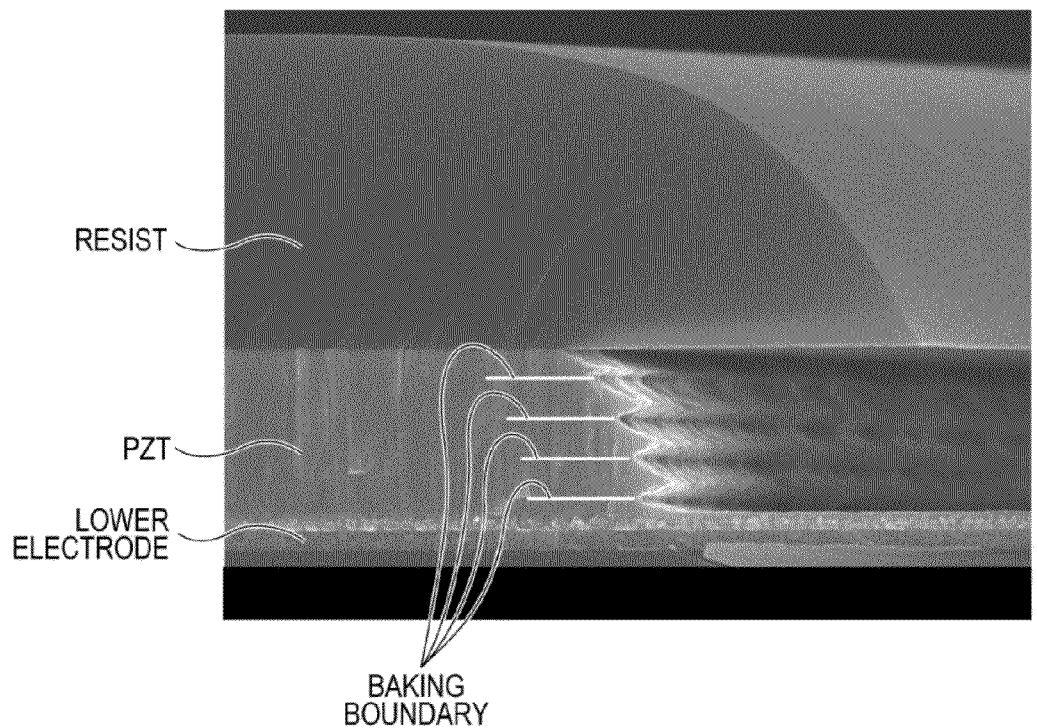
FIG. 6 is an SEM image of a piezoelectric layer.

FIG. 6 is an SEM image of the piezoelectric layer. The figure is an SEM image in which a resist is formed on the first electrode (lower electrode), and the piezoelectric layer in which the plurality of piezoelectric films which are formed of PZT are laminated on the insulating film, and the resist is already subject to wet etching. It is understood that a groove having an inner face facing the first electrode side is formed on each interface (baked interface) of the piezoelectric film.

As illustrated in FIGS. 1 to 2B, a protecting substrate 30 which protects the piezoelectric element 300 is bonded onto the flow path forming substrate 10 on which the piezoelectric element 300 is formed using an adhesive 35. A piezoelectric element maintaining unit 31 which is a concave portion which partitions a space for accommodating the piezoelectric element 300 is provided on the protecting substrate 30. In addition, a manifold unit 32 which configures a part of the manifold 100 is provided on the protecting substrate 30. The manifold unit 32 is formed over the width direction of the pressure generating chamber 12 by passing through the protecting substrate 30 in the thickness direction, and communicates with the communication unit 15 of the flow path forming substrate 10, as described above. In addition, a through hole 33 which passes through the protecting substrate 30 in the thickness direction is provided on the protecting substrate 30. The lead electrode 90 which is connected to the first electrode 60 of the piezoelectric element 300 is exposed in the through hole 33. One end of connection wiring which is connected to a driving circuit (not shown) is connected to the through hole 33 in the lead electrode 90 which is connected to the first electrode 60 of each of the piezoelectric elements 300.

A compliance substrate 40 which is formed by a sealing film 41 and a fixing plate 42 is bonded onto the protecting substrate 30. The sealing film 41 is formed of a material which has low rigidity, and is flexible, and one surface of the manifold unit 32 is sealed using the sealing film 41. In addition, the fixing plate 42 is formed of a hard material such as metal. Since a region facing the manifold 100 of the fixing plate 42 becomes an opening portion 43 which is completely removed in the thickness direction, one surface of the manifold 100 is sealed only using the flexible sealing film 41.

In such a ink jet recording head I according to the embodiment, ink is taken from an ink supply port which is connected to an external ink supply unit which is not shown, and ink is filled in the liquid flow path from the manifold 100 to the nozzle opening 21, and then a voltage is applied between the respective first electrode 60 and the second electrode 80 corresponding to the pressure generating chamber 12 according to a recording signal from the driving circuit. Due to this, the vibrating plate 50 is deflected along with the piezoelectric element 300, a pressure in each of the pressure generating chambers 12 rises, and ink droplets are ejected from each of the nozzle openings 21.

Here, a manufacturing method of such an ink jet recording head according to the embodiment will be described. In addition, FIGS. 7A to 10C are cross-sectional views in the first direction X which illustrate the manufacturing method of the ink jet recording head.

Figure 7A:
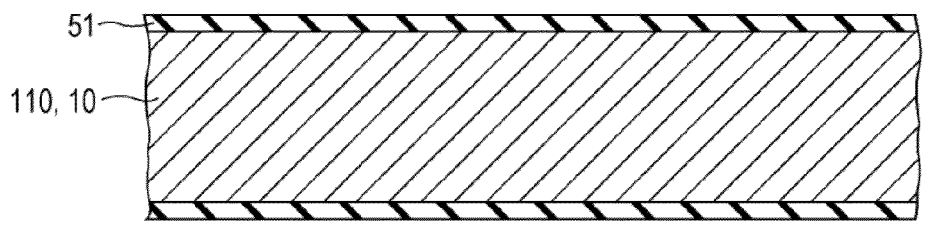
FIGS. 7A to 7C are cross-sectional views which illustrate a manufacturing method of the recording head according to the first embodiment.

First, as illustrated in FIG. 7A, the elastic film 51 is formed on the surface of a wafer for a flow path forming substrate 110 as a silicon wafer. According to the embodiment, the elastic film 51 which is formed of silicon dioxide is formed by performing thermal oxidization with respect to the wafer for a flow path forming substrate 110. As a matter of course, a forming method of the elastic film 51 is not limited to the thermal oxidization, and the elastic film may be formed using a sputtering method, a CVD method, or the like.

Figure 7B:
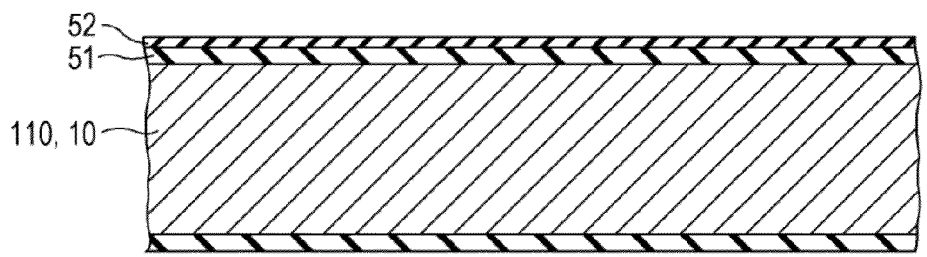

Subsequently, as illustrated in FIG. 7B, the insulating film 52 which is formed of zirconium oxide is formed on the elastic film 51. The insulating film 52 may be formed by forming zirconium using the sputtering method, or the like, and then by performing the thermal oxidization using heating, or may be formed by forming zirconium oxide using the reactive sputtering method. The vibrating plate 50 is formed by the elastic film 51 and the insulating film 52.

Figure 7C:
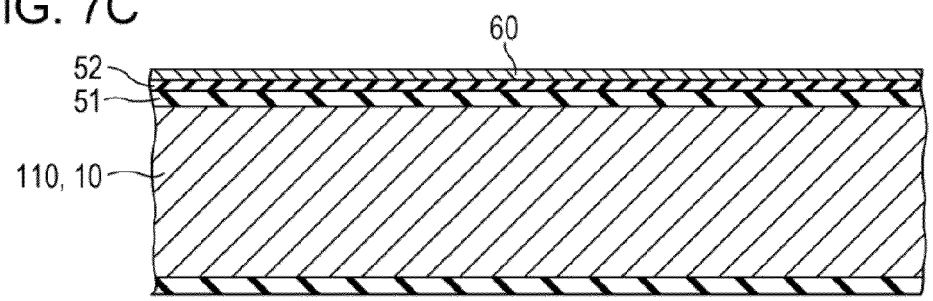

Subsequently, as illustrated in FIG. 7C, the first electrode 60 is formed on the entire surface of the insulating film 52. A material of the first electrode 60 is not particularly limited, however, when lead zirconate titanate (PZT) is used as the piezoelectric layer 70, it is preferable to use a material in which a change in conductivity due to diffusion of lead oxide is small. For this reason, as the material of the first electrode 60, platinum, iridium, or the like, is preferably used. In addition, it is possible to form the first electrode 60 using, for example, a sputtering method, a physical vapor deposition (PVD) method, or the like.

Figure 8A:
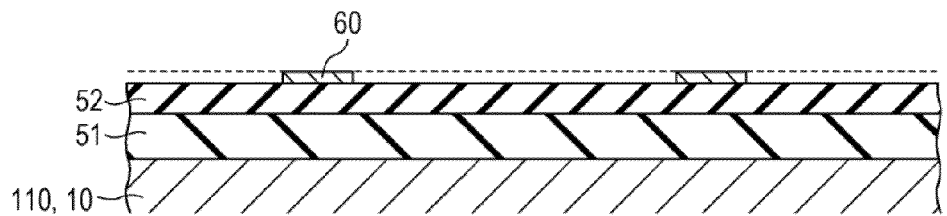
FIGS. 8A to 8C are cross-sectional views which illustrate the manufacturing method of the recording head according to the first embodiment.

Subsequently, as illustrated in FIG. 8A, the first electrode 60 is subject to patterning. The patterning can be performed using, for example, dry etching such as ion milling.

In addition, though it is not particularly illustrated, a crystalline seed layer which is formed of titanium (Ti) may be formed on the first electrode 60. By forming the crystalline seed layer on the first electrode 60, it is possible to control a preferred orientation of the piezoelectric layer 70 in (100), and to obtain a piezoelectric layer 70 which is preferable as an electromechanical conversion element when forming the piezoelectric layer 70 on the first electrode 60 through the crystalline seed layer. As the crystalline seed layer, titanium (Ti), and titanium oxide (TiO$_2$) may be used, and it is also possible to use materials other than titanium and titanium oxide, for example, lanthanum nickel oxide, or the like.

Subsequently, according to the embodiment, the piezoelectric layer 70 which is formed of lead zirconate titanate (PZT) is formed. Here, according to the embodiment, the piezoelectric layer 70 is formed using a so-called sol-gel method in which the piezoelectric layer 70 which is formed of metal oxide is obtained by making so-called sol in which metal complex is dissolved in a solvent, and is dispersed into gel by being coated and dried, and baking thereof at a high temperature. In addition, the manufacturing method of the piezoelectric layer 70 is not limited to the sol-gel method, and a Metal-Organic Decomposition (MOD) method, a sputtering method, or a Physical Vapor Deposition (PVD) method such as a laser ablation method may be used, for example. That is, the piezoelectric layer 70 may be formed using any one of a liquid phase method and a gas phase method.

Figure 8B:
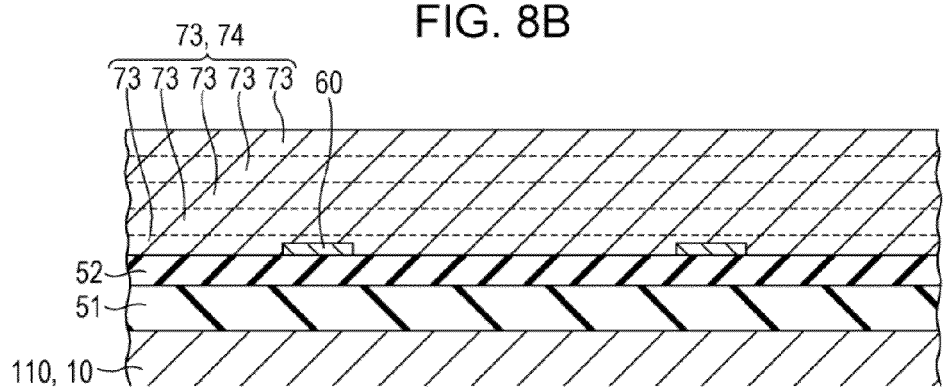

As a specific forming procedure of the piezoelectric layer 70, first, as illustrated in FIG. 8B, a piezoelectric precursor film 73 as a PZT precursor film is formed on the first electrode and the insulating film 52. That is, sol (solution) including a metal complex is applied (application processing) onto the wafer for a flow path forming substrate 110 on which the first electrode 60 is formed. The application method of the sol is not particularly limited, and for example, there is a spin coat method using a spin coat apparatus, a slit coat method using a slit coater, or the like. Subsequently, the piezoelectric precursor film 73 is heated at a predetermined temperature, and is dried for a certain period of time (drying process). For example, according to the embodiment, it is possible to dry the piezoelectric precursor film 73 by maintaining the piezoelectric precursor film for 8 minutes to 30 minutes at a temperature of 170° to 180°.

Subsequently, the dried piezoelectric precursor film 73 is subject to degreasing (degreasing process) by being heated at a predetermined temperature, and being maintained for a certain period of time. For example, according to the embodiment, the piezoelectric precursor film 73 is subject to the degreasing by being heated at approximately a temperature of 300° to 400°, and being maintained approximately for 10 minutes to 30 minutes. In addition, the degreasing referred to here is a process in which organic components which are included in the piezoelectric precursor film 73 are separated from the film as, for example, NO$_2$, CO$_2$, H$_2$O, or the like.

Subsequently, the piezoelectric film 74 is formed when crystallizing a piezoelectric precursor film 73 by heating the film at a predetermined temperature, and maintaining the film for a certain period of time (baking process). In the baking process, it is preferable that the piezoelectric precursor film 73 be heated at a temperature of equal to or greater than 700° C. In addition, in the baking process, it is preferable that a temperature rising rate be set to equal to or greater than 50° C./sec. Due to this, it is possible to obtain a piezoelectric film 74 which has an excellent property.

As illustrated in FIG. 8B, the piezoelectric layer 70 which is formed of the plurality of piezoelectric films 74 is formed by repeating a plurality of piezoelectric film formation processes which are configured of the above described application process, drying process, degreasing process, and baking process. The piezoelectric film 74 may be formed in each layer, or may be formed as the plurality of piezoelectric films 74 by forming the plurality of piezoelectric precursor films 73, by repeating the application process, the drying process, and the degreasing process, and collectively performing the baking process with respect to the plurality of piezoelectric precursor films.

In addition, as a heating device which is used in the drying process, the degreasing process, and the baking process, for example, it is possible to use a hot plate, a Rapid Thermal Processing (RTP) device which performs heating using radiation of a infrared lamp, or the like.

Figure 8C:
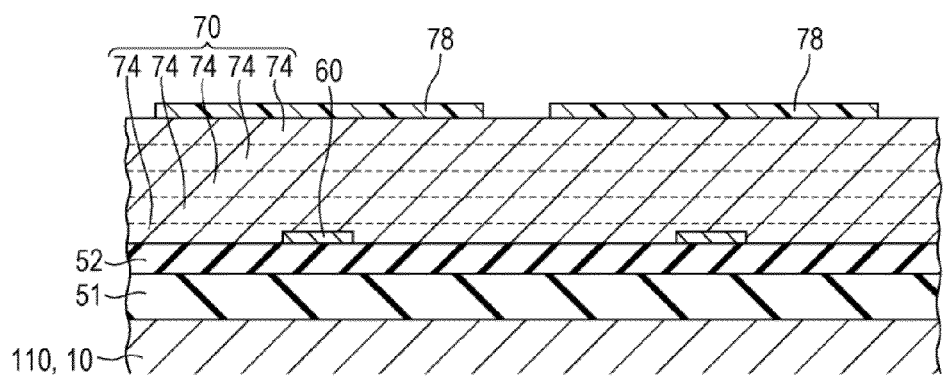

Subsequently, as illustrated in FIG. 8C, patterning is performed so that a resist film 78 is formed in each region in which each of the piezoelectric elements 300 of the piezoelectric layer 70 is formed using a photolithography method. The resist film 78 is formed so as to be larger than at least a top face of the piezoelectric layer 70.

Figure 9A:
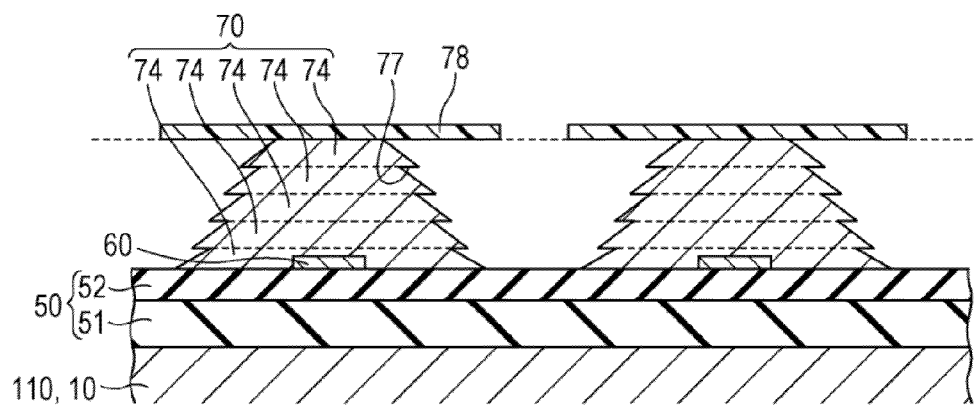
FIGS. 9A and 9B are cross-sectional views which illustrate the manufacturing method of the recording head according to the first embodiment.

Subsequently, as illustrated in FIG. 9A, the piezoelectric layer 70 is patterned using wet etching in a region facing each of the pressure generating chambers 12, and the groove 77 is formed on the side surface of the piezoelectric layer 70.

The piezoelectric layer 70 is formed by the plurality of piezoelectric films 74, and interfaces thereof are easily removed, selectively, using the wet etching. For this reason, the groove 77 at which the interface of each of the piezoelectric films 74 is recessed is preferably formed.

In addition, in the etching of the piezoelectric layer 70 due to the drying process, an arm portion of the vibrating plate 50 is subject to over etching, not only the etching of the piezoelectric layer 70. However, according to the wet etching in the invention, such over etching does not occur. That is, it is possible to process the vibrating plate 50, or the piezoelectric element 300 according to a design, and to obtain a desired property. In addition, by adopting the wet etching, it is possible to reduce cost of the piezoelectric element 300, and the ink jet recording head I, compared to a dry process.

In addition, according to the embodiment, the first electrode 60 is set to an individual electrode, and the width in the transverse direction (first direction X) thereof defines the width of the active unit 320 in the first direction X of the piezoelectric element 300. That is, the outside of the active unit 320 in the first direction X is the non-active unit of the piezoelectric element 300. Accordingly, even when precision in dimensions which are side etched using the wet etching is low, it is possible for the active unit 320 to not be side etched, since only the non-active unit is side etched.

A degree of tilting in the inner faces 75 and 76 of such a groove 77, the width in each of the piezoelectric films 74 after forming the groove 77, or whether or not to make the piezoelectric layer 70 be a tapered shape can be realized in a desired form by providing a difference in an etching rate between the third direction Z and the first and second directions X and Y which are directions orthogonal thereto. Specifically, it is possible to form the grooves 77 of various shapes which are described above by producing the difference in etching rate, by adjusting a baking temperature in the baking process, a degreasing temperature in the degreasing process, or a composition ratio of Zr when the piezoelectric layer 70 is formed of PZT.

In addition, in the wet etching, it is possible to use a well-known method. For example, it is possible to use a solution including 20% of BHF, and a mixed solution of nitric acid and hydrochloric acid. It is possible to use processes of two stages in which the wet etching is performed using only the solution including 20% of BHF, and a residual substance is removed using nitric acid, other than that.

Figure 9B:
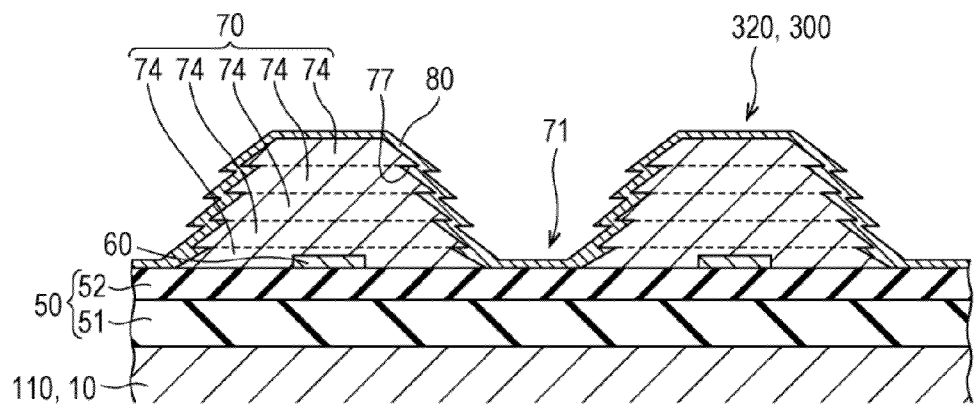

Subsequently, as illustrated in FIG. 9B, the resist film 78 is removed, and the second electrode 80 is formed over the piezoelectric layer 70 and the insulating film 52 thereon using the elecroless plating method. Specifically, the process is as follows. First, though it is not shown, a resist film is formed on the surface on the vibrating plate 50 side of the wafer for a flow path forming substrate 110, that is, on the surface of the vibrating plate 50 or the piezoelectric layer 70. In addition, the resist film is patterned so that a region in which the material of the second electrode 80, that is, nickel is precipitated is removed. The patterning of the resist film can be performed using a lithography method.

Subsequently, a catalyst is formed on the surface of the vibrating plate 50 or the piezoelectric layer 70. Specifically, the wafer for a flow path forming substrate 110 is dipped in a solution of the catalyst. The solution of the catalyst includes a catalyst component which functions as a catalyst of the electroless plating. As the catalyst component, it is possible to use palladium, for example.

Subsequently, the resist film is removed. Due to this, the catalyst which is provided on the resist film is removed together with the resist film, and the catalyst is formed only in a region in which nickel is precipitated in the wafer for a flow path forming substrate 110.

Subsequently, it is possible to precipitate nickel in a region in which the catalyst is provided by dipping the wafer for a flow path forming substrate 110 in an electroless plating solution including nickel. In this manner, the second electrode 80 is formed on a region in which the catalyst is provided.

In addition, it is also possible to form the second electrode 80 using a sputtering method, a physical vapor deposition (PVD) method, or the like.

In general, in the dry process such as the sputtering method, batch processing is not performed. In contrast to this, the batch processing is performed in the electroless plating method. Accordingly, since the batch processing can be performed in the embodiment, it is possible to manufacture the piezoelectric element 300 and the ink jet recording head I at low cost compared to the dry process. In addition, since the piezoelectric element 300 is not exposed to a high temperature or damage in the electroless plating method compared to the dry process, it is possible to obtain such a highly reliable piezoelectric element 300 with no damage.

Figure 10A:
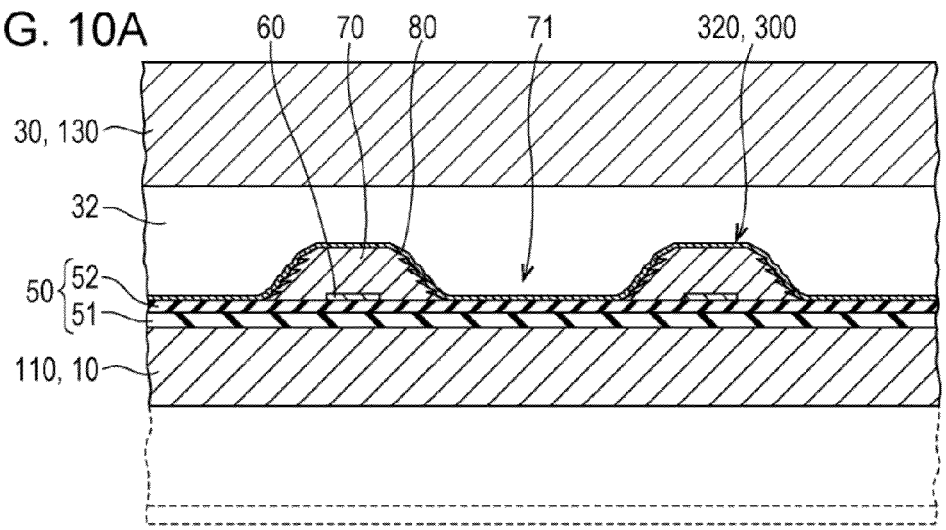
FIGS. 10A to 10C are cross-sectional views which illustrate the manufacturing method of the recording head according to the first embodiment.

Subsequently, as illustrated in FIG. 10A, the wafer for a flow path forming substrate 110 is made thin so as to have a predetermined thickness after bonding a wafer for a protecting substrate 130 which is a silicon wafer, and a plurality of protecting substrates 30 to the piezoelectric element 300 side of the wafer for a flow path forming substrate 110 using the adhesive 35 (refer to FIG. 2B).

Figure 10B:
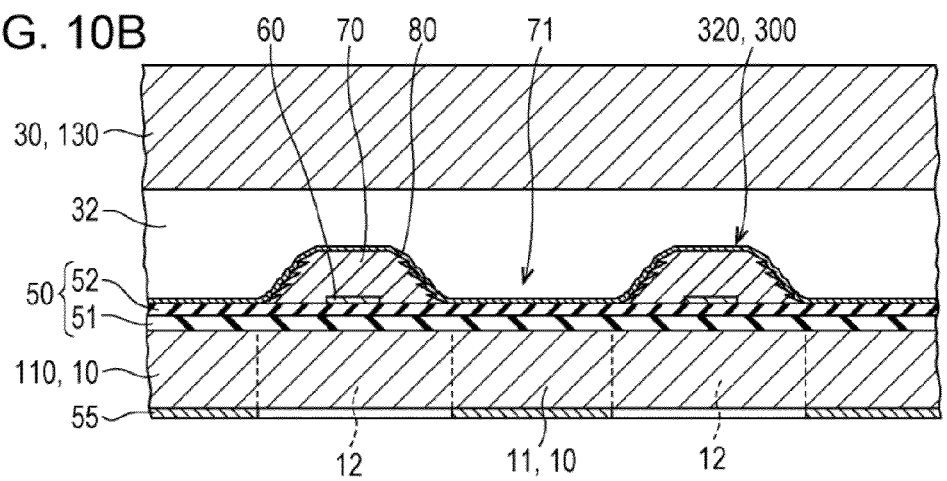
Figure 10C:
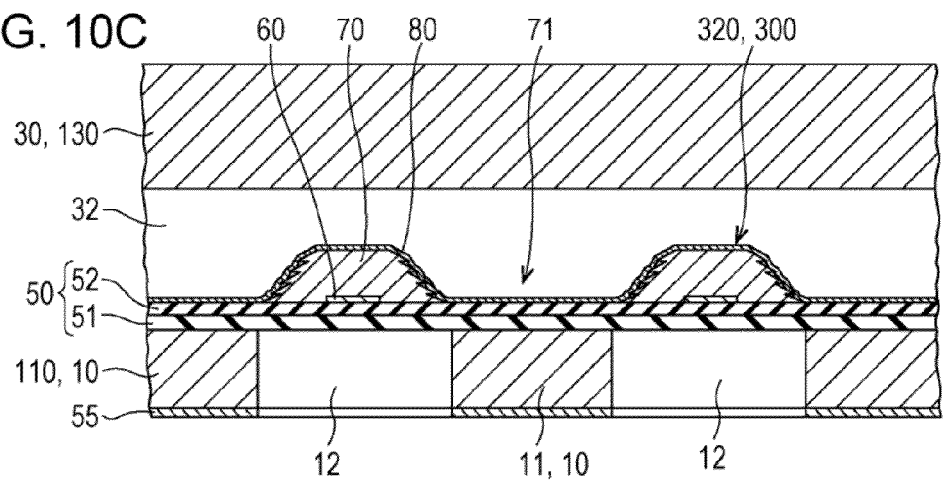

Subsequently, as illustrated in FIG. 10B, a mask film 55 is newly formed on the wafer for a flow path forming substrate 110, and is patterned in a predetermined shape. In addition, as illustrated in FIG. 10C, the pressure generating chamber 12 corresponding to the piezoelectric element 300, the ink supply path 13, the communicating path 14, and the communication unit 15 (refer to FIGS. 2A and 2B), and the like, are formed by performing anisotropic etching (wet etching) with respect to the wafer for a flow path forming substrate 110 through the mask film 55 using an alkaline solution such as KOH.

Thereafter, unnecessary portions on the outer peripheral portion of the wafer for a flow path forming substrate 110 and the wafer for a protecting substrate 130 are removed by cutting the portions using dicing, or the like, for example. In addition, the ink jet recording head according to the embodiment is made by bonding a nozzle plate 20 on which nozzle openings 21 are punched on a surface which is the side opposite to the wafer for a protecting substrate 130 of the wafer for a flow path forming substrate 110, bonding the compliance substrate 40 to the wafer for a protecting substrate 130, and dividing the wafer for a flow path forming substrate 110, or the like, into the flow path forming substrate 10, or the like, of one chip size as illustrated in FIG. 1.

Second Embodiment

Figure 11A:
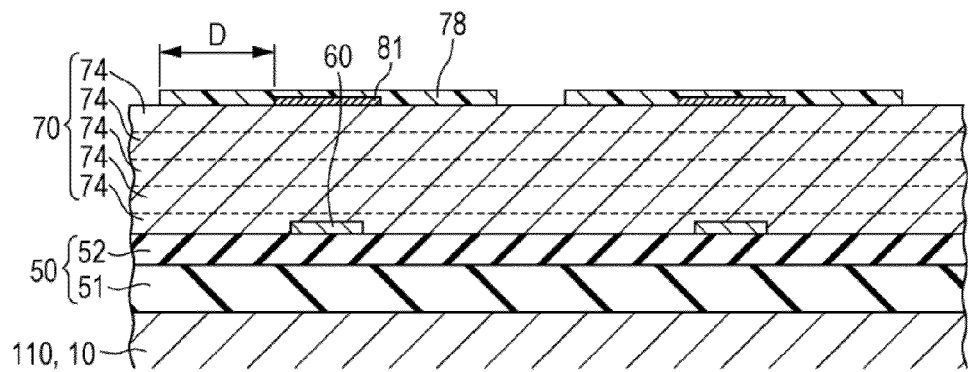
FIGS. 11A to 11C are cross-sectional views which illustrate a manufacturing method of a recording head according to a second embodiment.
Figure 11B:
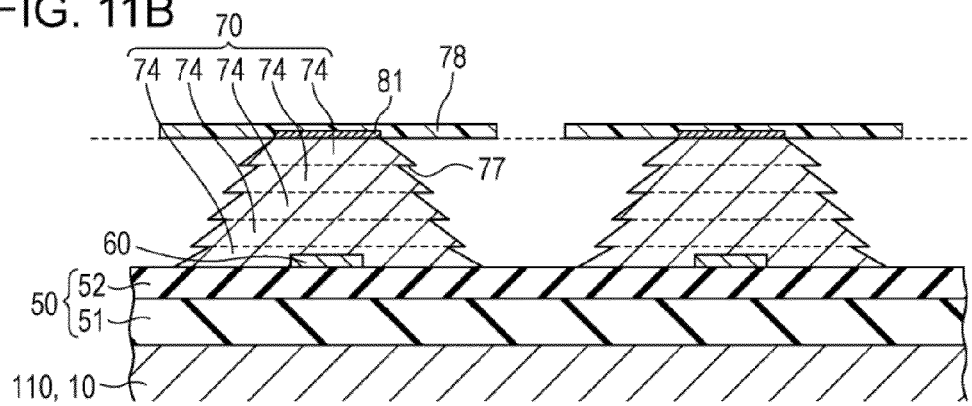
Figure 11C:
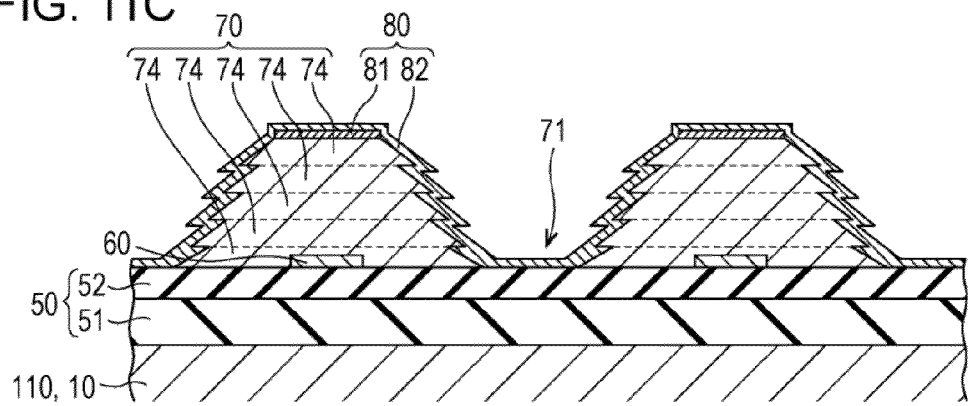

In the embodiment, in the manufacturing method of the ink jet recording head which is described in the first embodiment, another type of a process of forming the groove 77 on the side surface of the piezoelectric layer 70 will be exemplified. FIGS. 11A to 11C are cross-sectional views in the first direction X which illustrate a manufacturing method of an ink jet recording head.

First, similarly to the first embodiment, a first electrode 60 and a piezoelectric layer 70 are formed on an insulating film 52 (refer to FIGS. 7A to 8B).

Subsequently, as illustrated in FIG. 11A, a first layer 81 which configures a part of the second electrode 80 is formed on the piezoelectric layer 70. Specifically, platinum, iridium, or the like, is formed as a film on the piezoelectric layer 70 using a sputtering method, a physical vapor deposition (PVD) method, or the like. In addition, the first layer 81 is formed by patterning platinum, iridium, or the like, using a resist film as a mask. In the patterning, it is possible to use a well-known method such as a photolithography method, dry etching, or wet etching. The first layer 81 is formed so as to define the width of an active unit 320.

Incidentally, the first layer 81 functions as an electrode, and also functions as a diffusion prevention layer which prevents components from being diffused each other between the first layer and the piezoelectric layer 70. For example, when the first layer 81 is formed of iridium, the first layer suppresses over diffusing of components configuring the piezoelectric element 70 in the first layer 81, when being heated. In addition, when the first layer 81 includes an iridium layer on the piezoelectric layer 70, and a titanium layer on the iridium layer, the iridium layer suppresses diffusing of components of the titanium layer in the piezoelectric layer 70, when the layers are heated and oxidized. In addition, the titanium layer of the first layer 81 takes a role of improving a piezoelectric property of the piezoelectric layer 70, by adsorbing excessive components on the surface of the piezoelectric layer 70 (second electrode 80 side), for example, excessive lead on the surface of the piezoelectric layer 70 when the piezoelectric layer 70 includes lead.

In addition, a resist film 78 is formed on the first layer 81 and the piezoelectric layer 70. Specifically, each of regions of the piezoelectric layer 70 on which each of the piezoelectric elements 300 is formed is patterned so that the resist film 78 is formed using a photolithography method. The resist film 78 is formed so that the width becomes larger than that of the first layer 81. A difference in dimension D between the first layer 81 and the resist film 78 is set to be larger than amount of side etching in the piezoelectric layer 70 using a wet etching which will be described later.

Subsequently, as illustrated in FIG. 11B, the piezoelectric layer 70 is patterned in a region facing each of pressure generating chambers 12 using the wet etching, and grooves 77 are formed on the side surface of the piezoelectric layer 70.

Subsequently, as illustrated in FIG. 11C, the resist film 78 is removed, and a second layer 82 is formed over the first layer 81, the side surface of the piezoelectric layer 70, and the insulating film 52. A material of the second layer 82 is not limited when the material is conductive metal, and a manufacturing method thereof is also not limited. For example, when forming a second layer 82 which is formed of nickel, it is possible to use the electroless plating method similarly to the first embodiment.

In this manner, the second electrode 80 is formed from the first and second layers 81 and 82. Due to this, the piezoelectric element 300 including the active unit 320 in which the piezoelectric layer 70 is interposed between the first electrode 60 and the first layer 81 is formed.

Hereinafter, similarly to the first embodiment, an individual ink jet recording head is formed from the wafer for a flow path forming substrate 110 including the above described piezoelectric element 300 (refer to FIGS. 10A to 10C).

Third Embodiment

Figure 12:
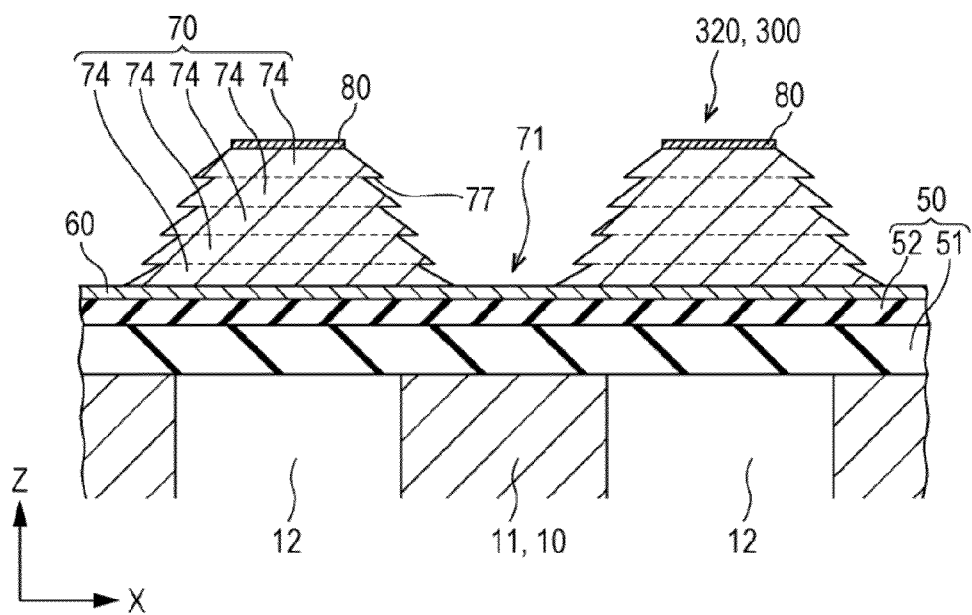
FIG. 12 is a cross-sectional view of a piezoelectric element according to a third embodiment.

According to the first embodiment and second embodiment, the first electrode 60 is set to an individual electrode, and the second electrode 80 is set to a common electrode, however, it may be reversed. FIG. 12 is a cross-sectional view of a piezoelectric element according to the embodiment in the first direction X.

As illustrated, a first electrode 60 is continuously provided so as to cover each of pressure generating chambers 12 on an insulating film 52, and configures a common electrode which is common to a plurality of piezoelectric elements 300.

Piezoelectric layers 70 which have grooves 77 on the side surface are individually formed in a region facing each of the pressure generating chambers 12 on the first electrode 60.

The second electrode 80 is formed on a top face of each of the piezoelectric layers 70. The second electrode 80 is cut into pieces for each pressure generating chamber 12, and configures an individual electrode which is independent in each piezoelectric element 300. Since the second electrode 80 is an individual electrode in this manner, the second electrode 80 is not formed on the groove 77 on the side surface of the piezoelectric layer 70, and the groove 77 is exposed.

Even in the piezoelectric element 300 in which the first electrode 60 is a common electrode, and the second electrode 80 is an individual electrode in this manner, it is possible to obtain the same operational effect as that of the first embodiment.

Fourth Embodiment

Figure 13:
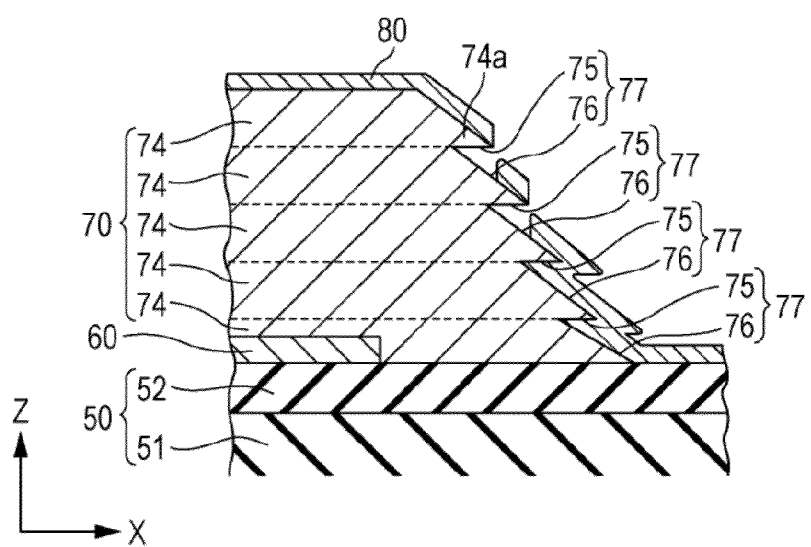
FIG. 13 is a cross-sectional view in which main portions of a piezoelectric element according to a fourth embodiment are enlarged.

According to the first embodiment, the second electrode 80 is formed using the electroless plating method, however, it is not limited to this. FIG. 13 illustrates a cross-sectional view in which main portions of a piezoelectric element 300 according to the embodiment are enlarged. In addition, the same units as those of the first embodiment will be given the same reference numerals, and repeated descriptions will be omitted.

The second electrode 80 according to the embodiment is formed using a sputtering method. That is, the second electrode 80 is formed by laminating an electrode material such as iridium on the surface of the uppermost layer of the piezoelectric layer 70, or on a part of an inner face 76 of each groove 77 (face facing second electrode 80 side) from the upper part of the piezoelectric layer 70. For this reason, the second electrode 80 is not formed up to a depth portion of the groove 77. In addition, the second electrode 80 also has a portion in which a part thereof is divided by the groove 77. In addition, even when the second electrode 80 is divided in a cross section in this manner, there is no problem in conducting, since the second electrode 80 is continuous in other regions (for example, region in vicinity of lead electrode 90 in Y direction, or the like (refer to FIG. 1)).

Since the groove 77 is also provided in the piezoelectric element 300 with such a configuration on the side surface of the piezoelectric layer 70, heat of the piezoelectric element 300 is radiated to the outside through the second electrode 80, or is directly radiated to the outside from the groove 77 in which the second electrode 80 is not provided. Accordingly, similarly to the first embodiment, in the piezoelectric element 300 according to the embodiment as well, it is possible to prevent a performance deterioration by suppressing an increase in a calorific value, and to obtain good piezoelectric performance.

Fifth Embodiment

Figure 14A:
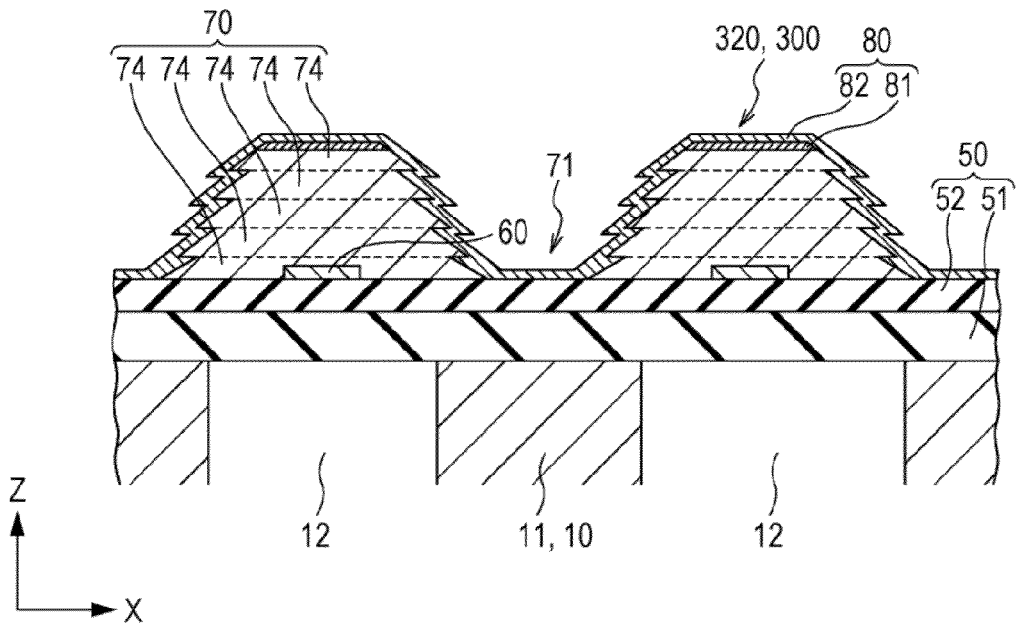
FIGS. 14A and 14B are a cross-sectional view of a piezoelectric element according to a fifth embodiment, and a cross-sectional view in which main portions of the piezoelectric element are enlarged.
Figure 14B:
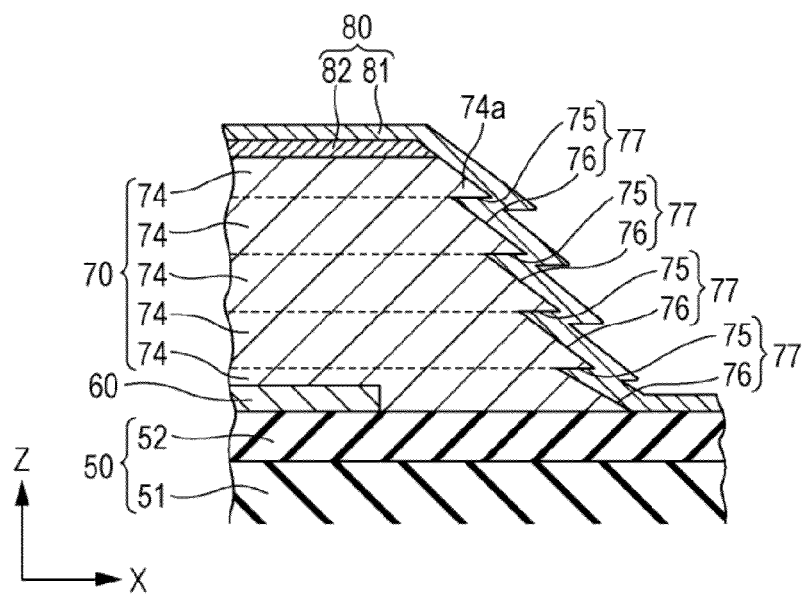
Figure 15A:
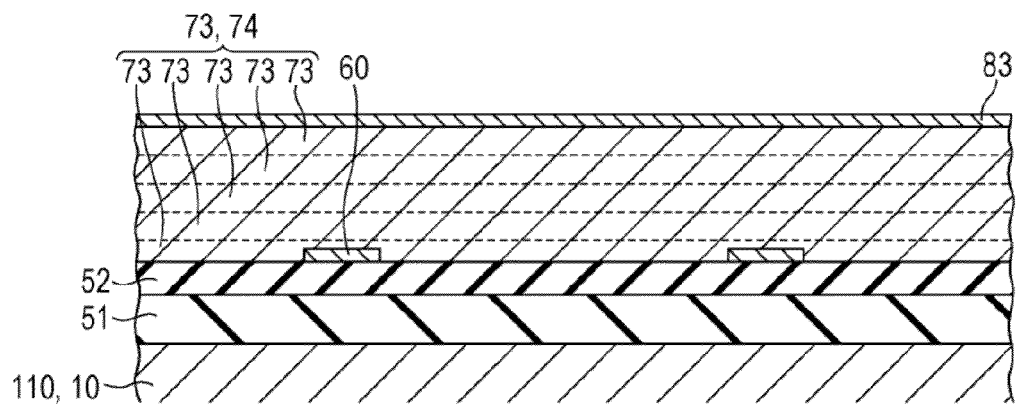
FIGS. 15A and 15B are cross-sectional views which illustrate a manufacturing method of a recording head according to the fifth embodiment.
Figure 15B:
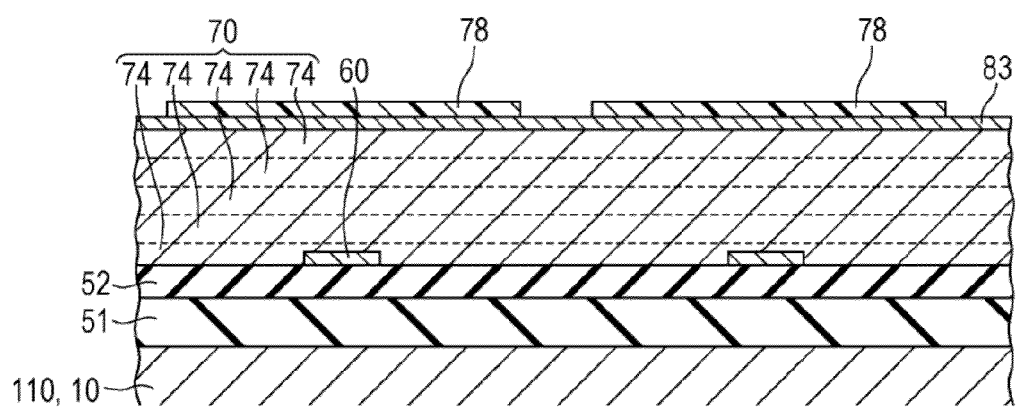

In the second embodiment, an example in which iridium, or the like, is used as the material of the first layer 81 of the second electrode 80 has been described, however, it is also possible to use conductive metal oxide as the first layer 81. FIGS. 14A and 14B are a cross-sectional view of a piezoelectric element according to the embodiment, and a cross-sectional view in which main portions are enlarged, and FIGS. 15A and 15B are cross-sectional views which describe a manufacturing method of a portion of a piezoelectric element in a manufacturing method of an ink jet recording head according to the embodiment. In addition, the same units as those of the first and second embodiments will be given the same reference numerals, and repeated descriptions will be omitted.

As illustrated in FIGS. 14A and 14B, a second electrode 80 according to the embodiment includes a first layer 81 on a piezoelectric layer 70 side, and a second layer 82 which is formed on the first layer 81.

The first layer 81 is formed of conductive metal oxide. As an example of such conductive metal oxide, there is $VO_2$, $V_2O_3$, $MoO_3$, $WO_3$, $SnO$, $ZnO$, or the like. In addition, as the conductive metal oxide, it is preferable to use lanthanum nickelate. As lanthanum nickelate, there is $LaNiO_3$, $La_3Ni_2O_6$, $LaNiO_2$, $La_2NiO_4$, $La_3Ni_2O_7$, $La_4Ni_3O_{10}$, or the like.

The second layer 82 is formed on the first layer 81, and is formed of a highly conductive metal material. As the second layer 82, for example, there is metal such as Ti, Pt, Ta, Ir, Sr, In, Sn, Au, Al, Fe, Cr, Ni, and Cu, or conductive carbon. In addition, the second layer 82 may be only one of these materials, or may be a material in which two or more materials thereof are mixed or laminated.

Since the first layer 81 is formed of a metal oxide film in this manner, the first layer is compatible with a plane orientation of the piezoelectric layer 70, and it is possible to prevent a defect, or the like, from occurring on an interface between the piezoelectric layer 70 and the first layer 81. In this manner, it is possible to obtain a piezoelectric element 300 with an excellent piezoelectric property.

In addition, since it is possible to use a metal film with low electrical resistance as the second layer 82, it is possible to prevent a function deterioration as an electrode.

A manufacturing method of the ink jet recording head according to the embodiment will be described. Here, since the ink jet recording head has the same configuration as that of the first embodiment excluding a formation of the piezoelectric element 300, a process of forming the piezoelectric element 300 will be mainly described.

First, similarly to the first embodiment (FIGS. 7A to 8B), the piezoelectric layer 70 which is formed of piezoelectric films 74 is formed by forming a piezoelectric precursor film 73 on a wafer for a flow path forming substrate 110 (refer to FIG. 8B), and baking the film.

Subsequently, as illustrated in FIG. 15A, a lanthanum nickelate layer 83 is formed on the piezoelectric film 74. A forming method of the lanthanum nickelate layer 83 is not particularly limited, however, it is possible to form the layer using, for example, a sputtering method, a laser ablation method, a MOCVD method, a sol-gel method, or a MOD method.

Subsequently, as illustrated in FIG. 15B, patterning is performed so that a resist film 78 is formed in a region in which each of the piezoelectric elements 300 of the piezoelectric layer 70 is formed using a photolithography method, on the lanthanum nickelate layer 83. The resist film 78 is formed so as to be larger than at least the top face of the piezoelectric layer 70.

Figure 16A:
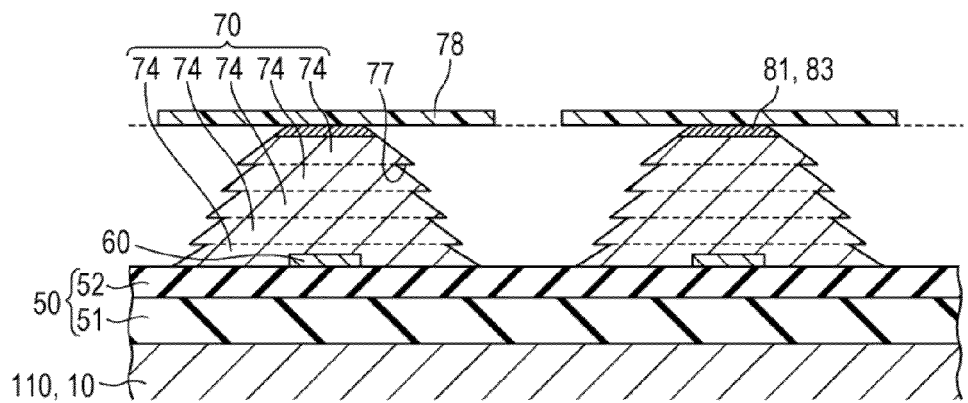
FIGS. 16A and 16B are cross-sectional views which illustrate the manufacturing method of the recording head according to the fifth embodiment.

Subsequently, as illustrated in FIG. 16A, only the lanthanum nickelate layer 83 and the piezoelectric layer 70 are subject to wet etching, selectively, using the resist film 78 as a mask.

In this manner, the piezoelectric layer 70 is patterned in a region facing each of the pressure generating chambers 12, and the groove 77 is formed on the side surface of the piezoelectric layer 70, similarly to the first embodiment. In addition, the lanthanum nickelate layer 83 is patterned on the top face of the piezoelectric layer 70, and becomes the first layer 81 which configures the second electrode 80.

In general, in conductive metal oxide such as the lanthanum nickelate layer 83, it is difficult to perform dry etching. However, since wet etching is adopted in the embodiment, it is possible to easily perform patterning of the lanthanum nickelate layer 83 compared to the dry etching. In addition, since patterning of the piezoelectric layer 70 is performed in the same process as that of the lanthanum nickelate layer 83 at the same time (performing the same etching), it is possible to reduce cost by simplifying processes.

Figure 16B:
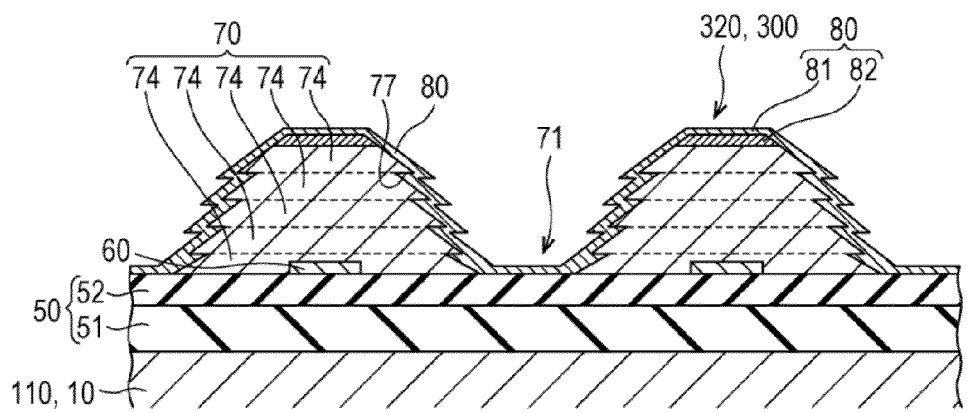

Subsequently, as illustrated in FIG. 16B, the second layer 82 is formed over the first layer 81, the side surface of the piezoelectric layer 70 (groove 77), and an insulating film 52 thereon after removing the resist film 78, and the second electrode 80 is formed.

A forming method of the second layer 82 is not particularly limited, however, the second layer may be formed using a wet process such as an electroless plating method similarly to the first embodiment, or may be formed using a dry process such as a sputtering method.

In this manner, the second electrode which is formed by the first layer 81 formed of conductive metal oxide, and the second layer 82 is formed, and the piezoelectric element 300 including an active unit 320 in which the piezoelectric layer 70 is interposed between the first electrode 60 and the first layer 81 is formed.

Hereinafter, similarly to the first embodiment, an individual ink jet recording head is formed from a wafer for a flow path forming substrate 110 which includes the above described piezoelectric element 300 (refer to FIGS. 10A to 10C).

Sixth Embodiment

An ultrasonic sensor which is one embodiment of the invention will be described. In addition, the embodiment which will be described does not unfairly limit contents of the invention which are described in aspects, and all of configurations which are described in the embodiment are not necessarily essential as solving means of the invention. In addition, the same members as those of the above described first embodiment will be given the same reference numerals, and repeated descriptions will be omitted.

According to the embodiment, transmission and reception of ultrasonic waves are performed using an electroacoustic converter which uses a piezoelectric effect. The electroacoustic converter is a piezoelectric element, uses a conversion of electrical energy into mechanical energy (inverse piezoelectric effect) when transmitting the ultrasonic waves, and in which the ultrasonic waves are transmitted when a change which is caused by contraction and extension of the piezoelectric layer excites a vibrating plate so as to be vibrated. Accordingly, in this case, the piezoelectric element is an ultrasonic wave transmitting element.

In addition, when receiving reflected ultrasonic waves from a measuring unit, conversion of mechanical energy into electrical energy (positive piezoelectric effect) is used, electrical energy is generated due to transformation of the piezoelectric later, and an image is formed by detecting a signal of the electrical energy. Accordingly, in this case, the piezoelectric element is an ultrasonic wave receiving element.

In addition, according to the embodiment, the piezoelectric element includes a vibrating plate, a first electrode which is provided on the vibrating plate, a piezoelectric layer which is provided on the first electrode, and a second electrode which is provided on the piezoelectric layer.

Figure 17A:
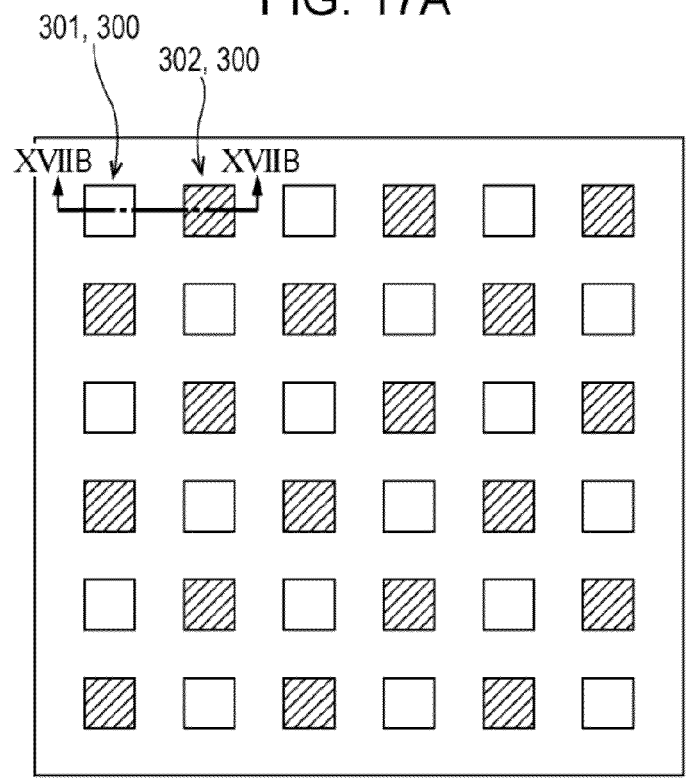
FIGS. 17A and 17B are a plan view of an ultrasonic sensor according to a sixth embodiment and a cross-sectional view thereof.
Figure 17B:
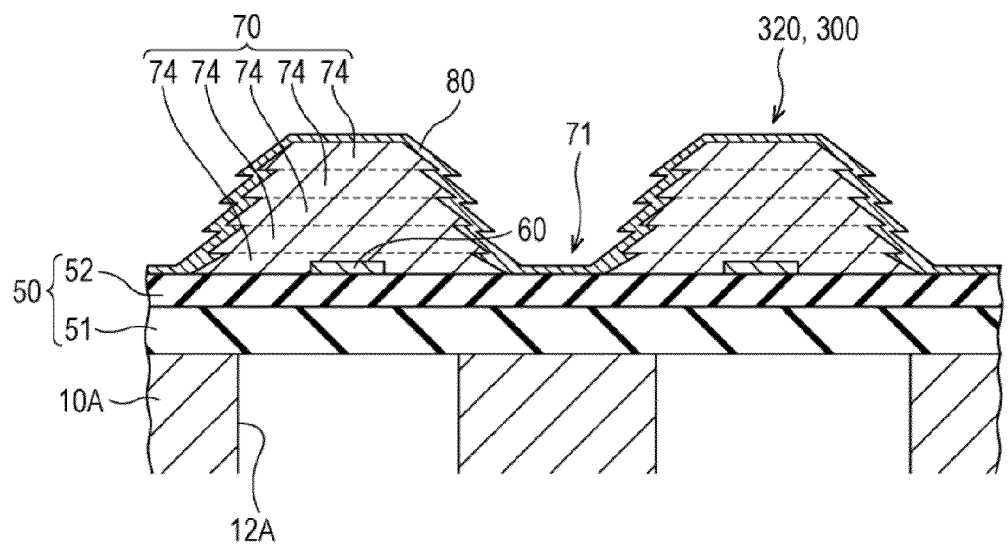

FIGS. 17A and 17B are a plan view of the ultrasonic sensor according to the embodiment and a cross-sectional view thereof which is taken along line XVII-XVII.

As illustrated in FIG. 17A, a plurality of ultrasonic transmitting elements 301 and a plurality of ultrasonic receiving elements 302 are formed by being arranged in an array shape, and an array sensor is formed. Directional angles of transmitting and receiving are made to be easy to align by alternately arranging the plurality of ultrasonic transmitting elements 301 and the plurality of ultrasonic receiving elements 302, and by causing a reception source and a transmission source of ultrasonic waves to have an aligned center axis of a transmission side and a reception side.

In addition, according to the embodiment, both the transmitting element 301 and the receiving element 302 are arranged on one substrate 10A in order to make the ultrasonic sensor small, however, it is also possible to arrange the transmitting element 301 and the receiving element 302 on a separate substrate, respectively, or to use a plurality of substrates depending on a use, according to functions of the elements. In addition, it is also possible to make one piezoelectric element have both functions as the transmitting element and receiving element using a time difference in transmitting and receiving.

In FIG. 17B, as an example which can be used as an ultrasonic transducer, for example, the substrate 10A is configured of single crystal silicon having an alignment of (100), (110), or (111). Alternatively, it is also possible to use a ceramic material which is represented by $ZrO_2$ or $Al_2O_2$, a glass ceramic material, an oxide substrate material such as MgO and $LaAlO_2$, and an inorganic material such as SiC, $SiO_2$, polycrystal silicon, and $Si_3N_4$, in addition to the silicon material. Alternatively, a laminated material in which these materials are combined may be used.

A vibrating plate 50 is formed on the upper part of the substrate 10A (piezoelectric layer 70 side). It is possible to use the substrate 10A as the vibrating plate 50 by thinning a part thereof, however, the piezoelectric layer 70, or the first electrode 60 may be used. In addition, it is also possible to make a film using a different material. In this case, the material may be, for example, silicon compound such as $SiO_2$, SiC, and $Si_3N_4$, polycrystal silicon, a ceramic material such as $ZrO_2$ and $Al_2O_3$, and oxide such as MgO, $LaAlO_3$, and $TiO_2$. Selecting of the film thickness and a material is determined based on a resonant frequency. In addition, it is preferable to use a material which can prevent diffusion of a material of the piezoelectric layer, for example, $ZrO_2$, or the like, in the surface layer of the vibrating plate 50 on the piezoelectric layer 70 side. In this case, an improvement of a piezoelectric property of the piezoelectric layer leads to an improvement of properties of transmitting and receiving of the ultrasonic sensor.

An opening portion 12A is formed on the substrate 10A. The opening portion 12A can be formed using a machining method such as etching, grinding, and laser processing according to a substrate material.

Since the first electrode 60, the piezoelectric layer 70, and the second electrode 80 are the same as those in the above described first embodiment, descriptions of the configuration will be omitted. In addition, since it is necessary to drive the ultrasonic sensor in a higher frequency region than the liquid ejecting head which is represented by the ink jet recording head I with respect to the first embodiment, physical properties such as the thickness of the piezoelectric layer 70, the vibrating plate 50, and each of the electrode materials, and Young's modulus may be adjusted.

In addition, wiring (not shown) is connected to the respective ultrasonic transmitting elements 301 and ultrasonic receiving elements 302, and each wiring is connected to a terminal unit (not shown) of a control substrate (not shown) through a flexible print substrate (not shown). A control unit (not shown) which is configured of an operation unit, a storage unit, or the like, is provided on the control substrate. The control unit is configured so as to control an input signal which is input to the ultrasonic transmitting elements 301, and to process an output signal which is output from the ultrasonic receiving elements 302.

In this manner, in the ultrasonic sensor in the present application, it is possible to obtain effects of miniaturizing the ultrasonic sensor, and a device on which the ultrasonic sensor is mounted, effects of thinning thereof, and an effect of energy saving, compared to a sensor in which a bulk type piezoelectric ceramics, or the like, is used, since it is possible to arrange a piezoelectric element 300 with high resolution which is created using a MEMS technology, and a driving voltage thereof is low.

In addition, it is possible to obtain an effect of improving transmission and reception efficiency of the ultrasonic waves, by improving displacement characteristics by making the film thickness of the piezoelectric layer 70 thin.

In addition, in the piezoelectric element 300 which configures the ultrasonic sensor according to the embodiment, it is possible to apply any one of configurations of the above described first to fifth embodiments. Accordingly, it is possible to provide an ultrasonic sensor in which an increase in a calorific value is suppressed, and a performance deterioration is prevented even when a piezoelectric element 300 according to any of the embodiments is applied.

In addition, when applying the piezoelectric element 300 in which the second electrode 80 is formed using the electroless plating method as in the first embodiment, it is possible to provide an ultrasonic sensor in which the piezoelectric element 300 is protected from a foreign substance, or the like, by the second electrode 80. In addition, when the piezoelectric element 300 in which conductive metal oxide is used in the first layer 81 of the second electrode 80 as in the fifth embodiment, in the piezoelectric element 300, occurring of a defect on the interface between the piezoelectric layer 70 and the first layer 81 is prevented, and a piezoelectric property thereof becomes excellent. Accordingly, a high performance ultrasonic sensor is provided by applying the piezoelectric element 300.

Other Embodiments

Hitherto, embodiments of the invention has been described, however, a basic configuration of the invention is not limited to the above described embodiments.

Figure 18:
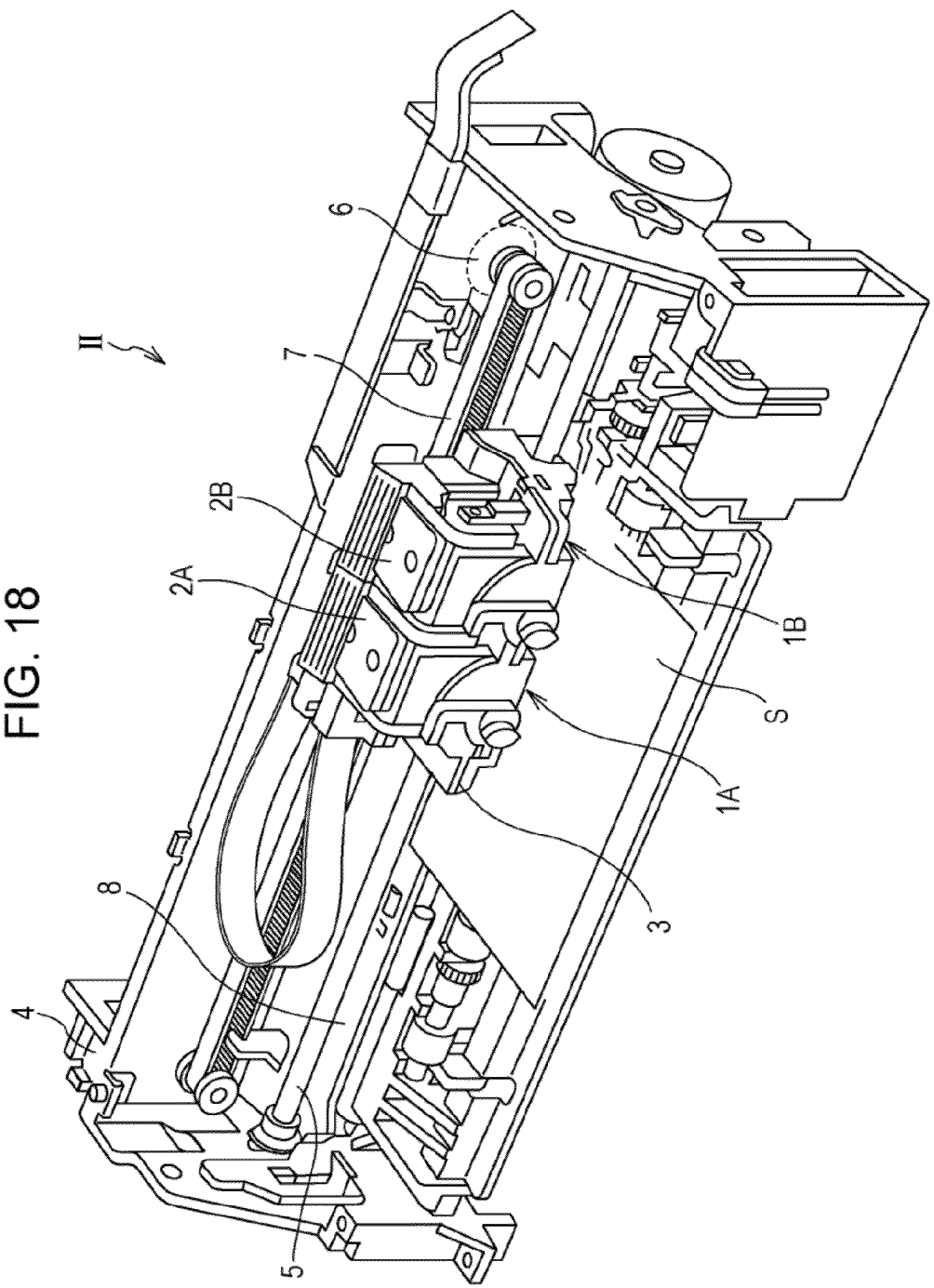
FIG. 18 is a schematic view of an ink jet recording device according to the embodiments.

For example, as illustrated in FIG. 18, an ink jet recording head I is mounted on an ink jet recording apparatus II. In a recording head unit 1 which includes the ink jet recording head I, a cartridge 2 which configures an ink supply unit is detachably provided, and a carriage 3 on which the recording head unit 1 is mounted is provided so as to be movable in the axial direction with respect to a carriage axis 5 which is attached to a device main body 4. The recording head unit 1 ejects, for example, a black ink composition, and a color ink composition.

In addition, the carriage 3 on which the recording head unit 1 is mounted moves along the carriage axis 5 when a driving power of a driving motor 6 is transmitted to the carriage 3 through a plurality of toothed gears (not shown), and a timing belt 7. On the other hand, a platen 8 is provided in the device main body 4 along the carriage axis 5, and a recording sheet S as a recording medium such as paper which is supplied by a paper feeding roller (not shown), or the like, is transported by being wound around a platen 8.

In addition, in the invention, it is possible to realize a uniform ejection property while suppressing a breakdown of the piezoelectric element 300 which configures the ink jet recording head I as described above. As a result, it is possible to realize the ink jet recording apparatus II in which a printing quality is improved, and durability is enhanced.

In addition, in the above described example, as the ink jet recording apparatus II, an apparatus in which the ink jet recording head I moves in the main scanning direction by being mounted on the carriage 3 has been exemplified, however, the configuration is not particularly limited. The ink jet recording apparatus II may be, for example, a so-called line type recording device in which printing is performed by fixing the ink jet recording head I, and by moving a recording sheet S such as paper in the sub-scanning direction.

In addition, in the above described embodiment, the invention has been described by exemplifying the ink jet recording head as an example of a liquid ejecting head, however, the invention makes the whole of liquid ejecting heads a target. As the liquid ejecting head, there is, for example, a color material ejecting head which is used when manufacturing a color filter of a liquid crystal display, or the like, an organic EL display, an electrode material ejecting head which is used when forming an electrode such as a field emission display (FED), a bio organic material ejecting head which is used when manufacturing a bio chip, or the like, in addition to various recording heads which are used in an image recording apparatus such as a printer.

In addition, the invention can be applied to an actuator device which is mounted on any device, not only such a liquid ejecting head (ink jet recording head). The actuator device in the invention can also be applied to, for example, various sensors, or the like.

Example 1

A main factor which causes a difference in an etching rate when performing wet etching with respect to a piezoelectric layer will be described, and a groove of the piezoelectric layer which is formed due to the difference in the etching rate will be exemplified.

FIGS. 19A to 19C are graphs which illustrate rate differences which are caused by a baking temperature, a degreasing temperature, and a composition ratio of Zr in PZT. The X direction in the figures denotes a first direction X and a second direction Y, and the Z direction denotes a third direction Z.

FIG. 19A illustrates a relationship between a baking temperature (horizontal axis) in a baking process when forming a piezoelectric layer and an etching rate (vertical axis). In any of baking temperatures, the etching rate in the X direction is larger than that in the Z direction. In addition, the higher the baking temperature, the smaller the differences in the etching rate in the X and Y directions. Accordingly, the higher the baking temperature, the shallower the groove which is formed in the piezoelectric layer, and the side surface of the piezoelectric layer becomes approximately parallel to the Z direction.

FIG. 19B illustrates a relationship between the degreasing temperature (horizontal axis) in the degreasing process when forming the piezoelectric layer and an etching rate (vertical axis). In any of degreasing temperatures, the etching rate in the X direction is larger than that in the Z direction. In addition, the higher the degreasing temperature, the smaller the differences in the etching rate in the X and Y directions. Accordingly, the higher the greasing temperature, the shallower the groove which is formed in the piezoelectric layer, and the side surface of the piezoelectric layer becomes approximately parallel to the Z direction.

FIG. 19C illustrates a relationship between the composition ratio of Zr (horizontal axis) when forming the piezoelectric layer which is formed of PZT and an etching rate (vertical axis). When the composition ratio is approximately equal to or smaller than 65%, the etching rate in the X direction is large, and when the composition ratio is approximately equal to or greater than 65%, the etching rate in the Z direction is large. In addition, when the composition ratio is approximately 30%, there is little difference in the etching rate. The higher the composition ratio, the larger the difference in the etching rate when the composition ratio is 30% to 50%, and the higher the composition ratio, the smaller the difference in the etching rate when the composition ratio is 50% to 65%. In addition, when the composition ratio exceeds 65%, a difference in the etching range becomes large.

Since it is possible to adjust the difference in the etching rate by appropriately adjusting the baking temperature, the greasing temperature, and the Zr composition ratio in this manner, a groove having a desired shape can be provided on the piezoelectric layer. In particular, it is possible to form a deeper groove when the etching rate in the X direction becomes larger with respect to the Z direction, since the interface of the piezoelectric film 74 is selectively removed, easily, using wet etching.

In addition, such a difference in the etching rate may be set to the same condition in the entire piezoelectric film of the piezoelectric layer, and may be set to a different condition with respect to an individual piezoelectric film.

Figure 20:
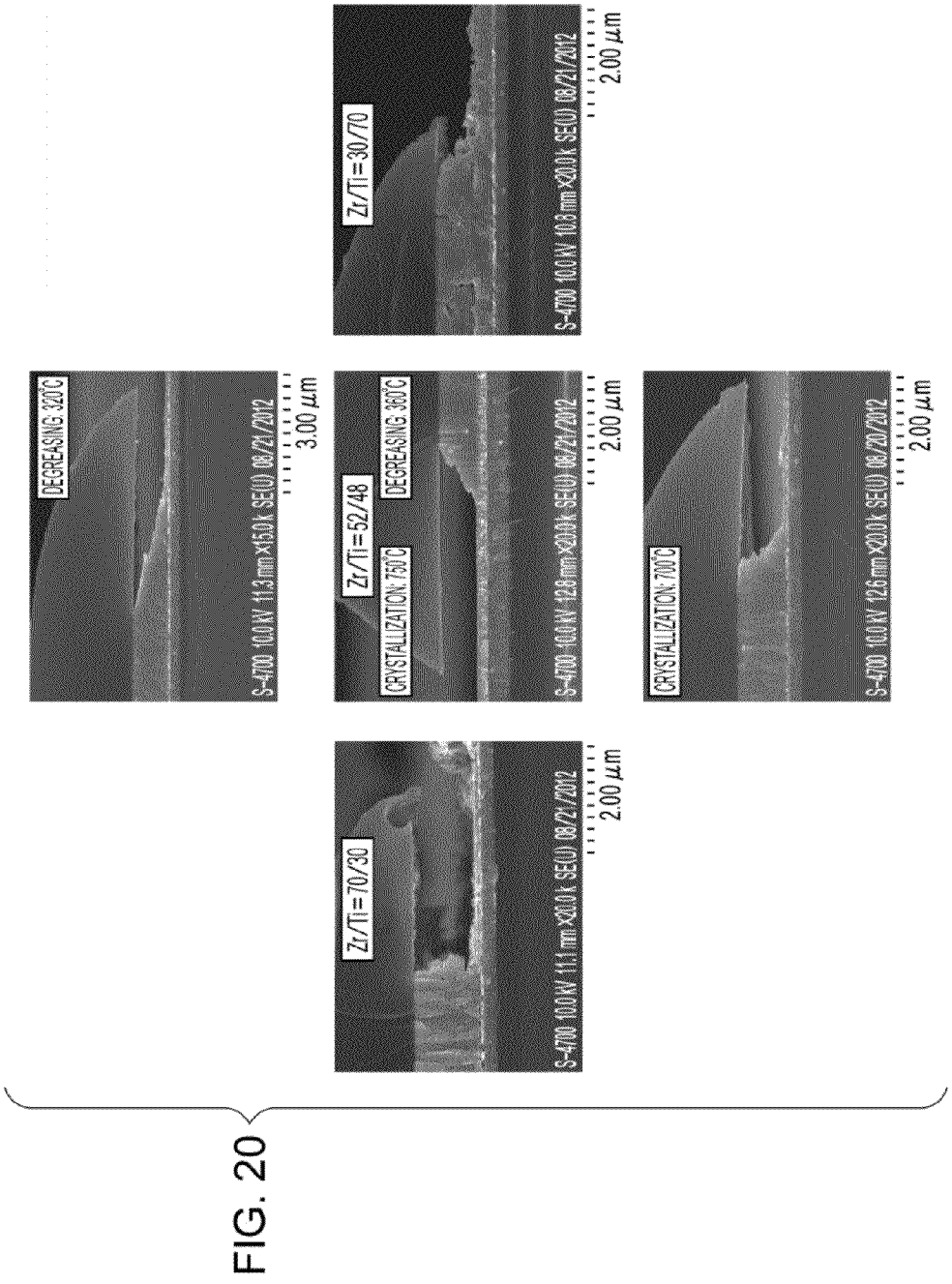
FIG. 20 is an SEM image of the piezoelectric layer according to an example.

FIG. 20 is an SEM image of a piezoelectric layer when wet etching is performed by appropriately adjusting a baking temperature, a degreasing temperature, and a composition ratio of Zr. A portion of a middle layer in each SEM image is a piezoelectric layer.

The upper stage side in FIG. 20 is a piezoelectric layer when a degreasing temperature is set to 320° C. It is understood that, when the degreasing temperature is 320° C., a deep groove is formed, and a tapered shape on the side surface of the piezoelectric layer is largely tilted, since the piezoelectric layer is largely etched in the X direction compared to the Z direction (refer to FIG. 19B).

The left side in the middle stage in FIG. 20 is a piezoelectric layer when a composition ratio of Zr is set to 70%. It is understood that, when the composition ratio of Zr is 70%, a shallow groove is formed, and the side surface of the piezoelectric layer becomes approximately parallel to the Z direction, since the piezoelectric layer is slightly largely etched in the Z direction compared to the X direction (refer to FIG. 19C).

A center in a middle stage in FIG. 20 is a piezoelectric layer when a baking temperature (crystallizing) is set to 750°, a composition ratio of Zr is set to 52%, and a degreasing temperature is set to 360°. It is understood that a deep groove is formed in the X direction by being deeply etched, and a tapered portion on the side surface of the piezoelectric layer is tilted in this case.

The right side in the middle stage in FIG. 20 is a piezoelectric layer when a composition ratio of Zr is set to 30%. It is understood that when the composition ratio of Zr is 30%, the piezoelectric layer is etched by the same degree in the X and Y directions, and a groove is formed, since there is little difference in the etching rates in the X and Y directions (refer to FIG. 19C).

A lower stage in FIG. 20 is a piezoelectric layer when a baking temperature (crystallizing) is set to 700° C. It is understood that when the baking temperature is 700° C., a groove is formed in the X direction, and a tapered portion on the side surface of the piezoelectric layer is tilted, since the piezoelectric layer is largely etched in the X direction compared to the Z direction (refer to FIG. 19A).

It is possible to form various grooves which are different on an interface of the piezoelectric film in this manner by adjusting a baking temperature, a degreasing temperature, and a composition ratio of Zr.

The entire disclosure of Japanese Patent Application No. 2013-039856, filed Feb. 28, 2013 is expressly incorporated by reference herein.

What is claimed is:
1. A liquid ejecting head comprising:
a piezoelectric element including a first electrode, a piezoelectric layer which is provided on the first electrode and on which a plurality of piezoelectric films are laminated, a second electrode which is provided on the piezoelectric layer, and a plurality of active units which are interposed between the first electrode and the second electrode, wherein the second electrode is common to multiple piezoelectric elements; and
a pressure generating chamber which communicates with nozzle openings which eject liquid, and in which a pressure fluctuation is generated by the piezoelectric element,
wherein a plurality of grooves with inner faces facing the first electrode side are formed on a side surface of the piezoelectric layer on each interface of each of the piezoelectric films along a direction which crosses a direction which goes from the first electrode to the second electrode,
wherein the second electrode is formed on the side surface of the piezoelectric layer,
wherein the second electrode is deposited to continuously cover an inside surface of the plurality of grooves, and
wherein each of the plurality of grooves has a similar shape and orientation.

2. The liquid ejecting head according to claim 1,
wherein the piezoelectric layer is formed so that the piezoelectric film on the first electrode side protrudes to an outside of the piezoelectric film on the second electrode side.

3. The liquid ejecting head according to claim 1,
wherein the second electrode is formed using an electroless plating method.

4. The liquid ejecting head according to claim 1,
wherein the second electrode includes a first layer formed of conductive metal oxide which is formed on the piezoelectric layer, and a conductive second layer which is formed on the first layer.

5. The liquid ejecting head according to claim 4,
wherein the second layer of the second electrode is formed using an electroless plating method.

6. A liquid ejecting apparatus comprising:
the liquid ejecting head according to claim 1.

7. A liquid ejecting apparatus comprising:
the liquid ejecting head according to claim 2.

8. A liquid ejecting apparatus comprising:
the liquid ejecting head according to claim 3.

9. A liquid ejecting apparatus comprising:
the liquid ejecting head according to claim 4.

10. A liquid ejecting apparatus comprising:
the liquid ejecting head according to claim 5.

11. A piezoelectric element comprising:
a first electrode;
a piezoelectric layer which is provided on the first electrode and on which a plurality of piezoelectric films are laminated;
a second electrode which is provided on the piezoelectric layer, wherein the second electrode is a common electrode that is common to multiple piezoelectric elements; and
a plurality of active units which are interposed between the first electrode and the second electrode,
wherein a plurality of grooves with inner faces facing the first electrode side are formed on a side surface of the piezoelectric layer on each interface of each of the piezoelectric layers along a direction which crosses a direction which goes from the first electrode to the second electrode,
wherein the second electrode is formed on the side surface of the piezoelectric layer,
wherein the second electrode is deposited to continuously cover an inside surface of the plurality of grooves, and
wherein each of the plurality of grooves has a similar shape and orientation.

12. An ultrasonic sensor comprising:
the piezoelectric element according to claim 11.

* * * * *